United States Patent
Yamazaki et al.

(10) Patent No.: US 8,105,855 B2
(45) Date of Patent: Jan. 31, 2012

(54) METHOD OF MANUFACTURING LIGHT EMITTING DEVICE

(75) Inventors: Shunpei Yamazaki, Tokyo (JP);
Takashi Hamada, Kanagawa (JP);
Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 10 days.

(21) Appl. No.: 12/533,338

(22) Filed: Jul. 31, 2009

(65) Prior Publication Data
US 2010/0029029 A1 Feb. 4, 2010

Related U.S. Application Data

(63) Continuation of application No. 11/652,284, filed on Jan. 11, 2007, now Pat. No. 7,569,405, which is a continuation of application No. 11/036,299, filed on Jan. 14, 2005, now Pat. No. 7,163,836, which is a continuation of application No. 10/464,798, filed on Jun. 18, 2003, now Pat. No. 6,858,464.

(30) Foreign Application Priority Data

Jun. 19, 2002 (JP) .................................. 2002-179078
Jun. 28, 2002 (JP) .................................. 2002-189409

(51) Int. Cl.
*H01L 21/00* (2006.01)
(52) U.S. Cl. ................. 438/29; 438/22; 438/30
(58) Field of Classification Search .................... 438/22, 438/29, 30
See application file for complete search history.

(56) References Cited

U.S. PATENT DOCUMENTS

| | | | |
|---|---|---|---|
| 3,060,429 A | 10/1962 | Winston | |
| 3,147,142 A | 9/1964 | Rudo | |
| 3,416,153 A | 12/1968 | Hertz et al. | |
| 3,596,275 A | 7/1971 | Sweet | |
| 3,659,401 A * | 5/1972 | Giammarco | 95/175 |
| 3,747,120 A | 7/1973 | Stemme | |
| 3,946,398 A | 3/1976 | Kyser et al. | |
| 4,138,284 A | 2/1979 | Postupack | |
| 4,226,182 A | 10/1980 | Danielsen et al. | |
| 4,620,196 A | 10/1986 | Hertz et al. | |

(Continued)

FOREIGN PATENT DOCUMENTS

EP 0 185 384 A1 6/1986

(Continued)

OTHER PUBLICATIONS

Sweet, R.G. "High Frequency Recording with Electrostatically Deflected Ink Jets," Rev. Sci. Instrum (Review of Scientific Instruments), vol. 36, No. 2, Feb. 1, 1965, pp. 131-136.

(Continued)

*Primary Examiner* — Phuc Dang
(74) *Attorney, Agent, or Firm* — Husch Blackwell LLP

(57) ABSTRACT

A method of manufacturing a light emitting device is provided which requires low cost, is easy, and has high throughput. The method of manufacturing a light emitting device is characterized in that: a solution containing a light emitting material is ejected to an anode or cathode under reduced pressure; a solvent in the solution is volatilized until the solution reaches the anode or cathode; and the remaining light emitting material is deposited on the anode or cathode to form a light emitting layer. A burning step for reduction in film thickness is not required after the solution application. Therefore, the manufacturing method, which requires low cost and is easy but which has high throughput, can be provided.

41 Claims, 14 Drawing Sheets

U.S. PATENT DOCUMENTS

| | | | |
|---|---|---|---|
| 4,737,802 A | 4/1988 | Mielke | |
| 4,928,125 A | 5/1990 | Iino | |
| 5,149,759 A * | 9/1992 | Miess et al. | 528/348 |
| 5,150,132 A * | 9/1992 | Shimomura et al. | 347/65 |
| 5,247,190 A | 9/1993 | Friend et al. | |
| 5,264,376 A | 11/1993 | Abbott et al. | |
| 5,344,676 A | 9/1994 | Kim et al. | |
| 5,399,502 A | 3/1995 | Friend et al. | |
| 5,583,552 A | 12/1996 | Mutoh | |
| 5,584,739 A | 12/1996 | Itoh et al. | |
| 5,678,116 A | 10/1997 | Sugimoto et al. | |
| 5,811,020 A | 9/1998 | Alwan | |
| 5,895,932 A | 4/1999 | Bojarczuk, Jr. et al. | |
| 5,898,185 A | 4/1999 | Bojarczuk, Jr. et al. | |
| 5,916,729 A | 6/1999 | Kobayashi et al. | |
| 5,952,037 A | 9/1999 | Nagayama et al. | |
| 6,022,104 A | 2/2000 | Lin et al. | |
| 6,023,073 A | 2/2000 | Strite | |
| 6,211,538 B1 | 4/2001 | Park | |
| 6,245,393 B1 | 6/2001 | Thompson et al. | |
| 6,252,246 B1 | 6/2001 | Arai et al. | |
| 6,280,273 B1 | 8/2001 | Codama | |
| 6,300,021 B1 | 10/2001 | Gorog et al. | |
| 6,310,665 B1 | 10/2001 | Kido | |
| 6,319,321 B1 | 11/2001 | Hiraga et al. | |
| 6,348,359 B1 | 2/2002 | Van Slyke et al. | |
| 6,369,507 B1 | 4/2002 | Arai | |
| 6,380,672 B1 | 4/2002 | Yudasaka | |
| 6,403,392 B1 | 6/2002 | Burrows et al. | |
| 6,416,583 B1 | 7/2002 | Kitano et al. | |
| 6,511,545 B2 | 1/2003 | Banno et al. | |
| 6,513,891 B2 | 2/2003 | Eida | |
| 6,514,328 B1 | 2/2003 | Katoh et al. | |
| 6,518,949 B2 * | 2/2003 | Drzaic | 345/107 |
| 6,566,153 B1 | 5/2003 | Yang | |
| 6,576,975 B2 | 6/2003 | Yang | |
| 6,593,690 B1 | 7/2003 | McCormick et al. | |
| 6,599,582 B2 | 7/2003 | Kiguchi et al. | |
| 6,627,263 B2 | 9/2003 | Kitano et al. | |
| 6,642,651 B2 | 11/2003 | Yudasaka | |
| 6,696,105 B2 | 2/2004 | Hiroki et al. | |
| 6,730,357 B2 | 5/2004 | Kawase | |
| 6,784,118 B2 | 8/2004 | Hayashi et al. | |
| 6,808,749 B2 | 10/2004 | Morii et al. | |
| 6,821,553 B2 | 11/2004 | Miyashita et al. | |
| 6,843,937 B1 | 1/2005 | Kiguchi et al. | |
| 6,858,464 B2 | 2/2005 | Yamazaki et al. | |
| 6,864,638 B2 | 3/2005 | Ishihara et al. | |
| 6,882,102 B2 | 4/2005 | Yamazaki | |
| 6,884,700 B2 * | 4/2005 | Aoki et al. | 438/502 |
| 6,885,148 B2 | 4/2005 | Yudasaka | |
| 6,918,666 B2 * | 7/2005 | Sekiya | 347/107 |
| 7,141,817 B2 | 11/2006 | Nishi et al. | |
| 7,176,617 B2 | 2/2007 | Endo et al. | |
| 7,279,194 B2 | 10/2007 | Hiroki et al. | |
| 7,333,167 B2 * | 2/2008 | Kawase | 349/106 |
| 7,364,939 B2 | 4/2008 | Yudasaka | |
| 7,473,928 B1 | 1/2009 | Yamazaki et al. | |
| 7,521,722 B2 | 4/2009 | Yamazaki et al. | |
| 7,548,023 B2 | 6/2009 | Yamazaki et al. | |
| 2001/0017409 A1 | 8/2001 | Hiroki et al. | |
| 2002/0007786 A1 * | 1/2002 | Banno et al. | 118/688 |
| 2002/0009538 A1 | 1/2002 | Arai | |
| 2002/0024051 A1 | 2/2002 | Yamazaki et al. | |
| 2002/0030443 A1 | 3/2002 | Konuma et al. | |
| 2002/0031874 A1 | 3/2002 | Yamazaki et al. | |
| 2002/0075422 A1 | 6/2002 | Kimura et al. | |
| 2002/0093283 A1 * | 7/2002 | Seo et al. | 313/504 |
| 2002/0109456 A1 | 8/2002 | Morii et al. | |
| 2002/0155215 A1 | 10/2002 | Miyashita et al. | |
| 2002/0164416 A1 | 11/2002 | Yamazaki | |
| 2003/0122127 A1 | 7/2003 | Yonekura et al. | |
| 2003/0166311 A1 | 9/2003 | Miyazawa | |
| 2003/0221620 A1 | 12/2003 | Yamazaki | |
| 2005/0056969 A1 * | 3/2005 | Ghosh et al. | 264/442 |
| 2005/0147739 A1 | 7/2005 | Yamazaki et al. | |
| 2006/0180826 A1 | 8/2006 | Yamazaki et al. | |
| 2007/0218797 A1 | 9/2007 | Yamazaki et al. | |
| 2008/0180421 A1 | 7/2008 | Yudasaka | |
| 2009/0109143 A1 | 4/2009 | Yamazaki et al. | |
| 2010/0233358 A1 | 9/2010 | Yamazaki et al. | |

FOREIGN PATENT DOCUMENTS

| | | |
|---|---|---|
| EP | 0 854 024 A2 | 7/1998 |
| EP | 0 862 156 A1 | 9/1998 |
| EP | 0 875 382 A2 | 11/1998 |
| EP | 1 093 166 A2 | 4/2001 |
| EP | 1 122 801 A2 | 8/2001 |
| EP | 1 128 449 A2 | 8/2001 |
| GB | 2 360 489 A | 9/2001 |
| JP | 60-224551 | 11/1985 |
| JP | 62-501202 | 5/1987 |
| JP | 2-158348 | 6/1990 |
| JP | 4-220351 | 8/1992 |
| JP | 6-182980 | 7/1994 |
| JP | 8-122122 | 5/1996 |
| JP | 10-12377 | 1/1998 |
| JP | 10-113595 | 5/1998 |
| JP | 10-202153 | 8/1998 |
| JP | 10-214682 | 8/1998 |
| JP | 10-335061 | 12/1998 |
| JP | 11-54270 | 2/1999 |
| JP | 11-54272 | 2/1999 |
| JP | 11-76916 | 3/1999 |
| JP | 11-340129 | 12/1999 |
| JP | 2000-188251 | 7/2000 |
| JP | 2000-237672 | 9/2000 |
| JP | 2000-268967 | 9/2000 |
| JP | 2000-290566 | 10/2000 |
| JP | 2000-294375 | 10/2000 |
| JP | 2001-6875 | 1/2001 |
| JP | 2001-135704 | 5/2001 |
| JP | 2001-189192 | 7/2001 |
| JP | 2001-209073 | 8/2001 |
| JP | 2001-276726 | 10/2001 |
| JP | 2001-291588 | 10/2001 |
| JP | 2001-300394 | 10/2001 |
| JP | 2001-301189 | 10/2001 |
| JP | 2001-308082 | 11/2001 |
| JP | 2002-55220 | 2/2002 |
| JP | 2003-126760 | 5/2003 |
| JP | 2003-192499 | 7/2003 |
| JP | 2003-212685 | 7/2003 |
| JP | 2003-212686 | 7/2003 |
| JP | 2003-238286 | 8/2003 |
| JP | 2003-264072 | 9/2003 |
| JP | 2003-527955 | 9/2003 |
| WO | WO 86/03717 A1 | 7/1986 |
| WO | WO 01/70506 A2 | 9/2001 |

OTHER PUBLICATIONS

Pimbley, W.T. et al., "Satellite Droplet Formation in a Liquid Jet," IBM J. Res. Develop. (IBM Journal of Research and Development), vol. 21, No. 1, 1977, pp. 21-30.

Hertz, C.H. et al, "Ink Jet Printing of High Quality Color Images," Journal of Imaging Technology, vol. 15, No. 3, Jun. 1989, pp. 141-148.

Tsutsui, T. et al., "Electroluminescence in Organic Thin Films," Photochemical Processes in Organized Molecular Systems, 1991, pp. 437-450.

Baldo, M. et al., "Highly Efficient Phosphorescent Emission From Organic Electroluminescent Devices," Nature, Sep. 10, 1998, vol. 395, pp. 151-154.

Baldo, M. et al., "Very High-Efficiency Green Organic Light-Emitting Devices Based on Electrophosphorescence," Appl. Phys. Lett. (Applied Physics Letters), vol. 75, No. 1, Jul. 5, 1999, pp. 4-6.

Schenk, H. et al., "Polymers for Light Emitting Diodes," Eurodisplay '99: Proceedings of the 19th IDRC (International Display Research Conference Proceedings), Sep. 6, 1999, pp. 33-37.

Tsutsui, T. et al., "High Quantum Efficiency in Organic Light-Emitting Devices with Iridium-Complex as a Triplet Emissive Center,"

Jpn. J. Appl. Phys. (Japanese Journal of Applied Physics), vol. 38, part 2, No. 12B, Dec. 15, 1999, pp. L1502-L1504.

Hunter, I.M. et al., "Design of an Active Matrix Polymer-LED Display with Reduced Horizontal Cross-Talk," IDW '99: Proceedings of the 6th International Display Workshops, 1999, pp. 1095-1096.

Kimura, M. et al., "Low-Temperature Poly-Si TFT Driven Light-Emitting-Polymer Displays and Digital Gray Scale for Uniformity," IDW '99: Proceedings of the 6th International Display Workshops, 1999, pp. 171-174.

Shimoda, T. et al., "Technology for Active Matrix Light Emitting Polymer Displays," IEDM 99: Technical Digest of International Electron Devices Meeting, 1999, pp. 107-110.

Lee, J-D et al., "Two-Dimensional Nozzle Arrangement in a Monolithic Inkjet Printhead for High-Resolution and High-Speed Printing," IEDM 99: Technical Digest of International Electron Devices Meeting, 1999, pp. 127-130.

* cited by examiner

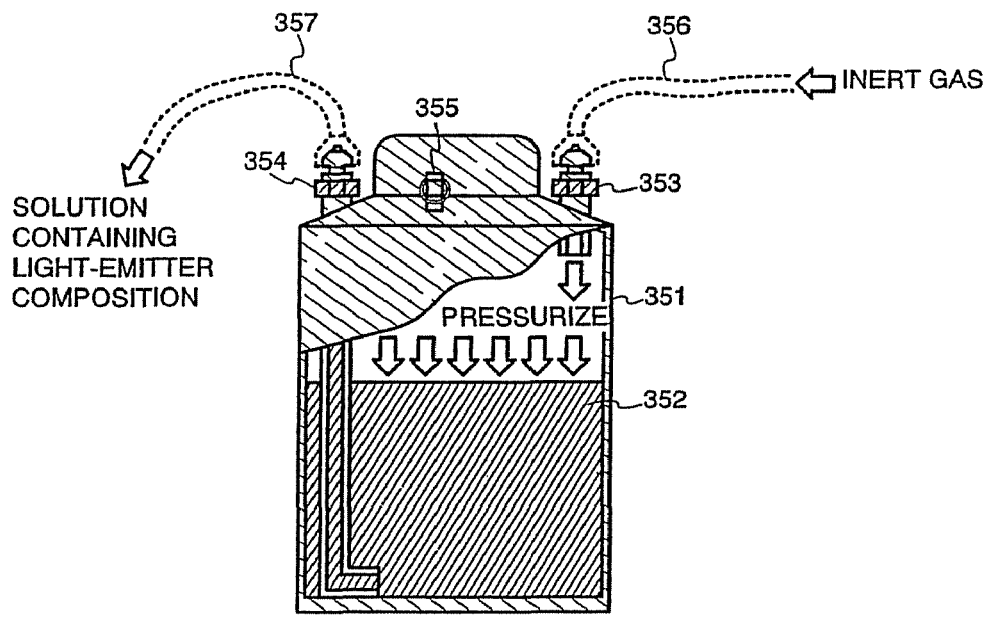
FIG. 4
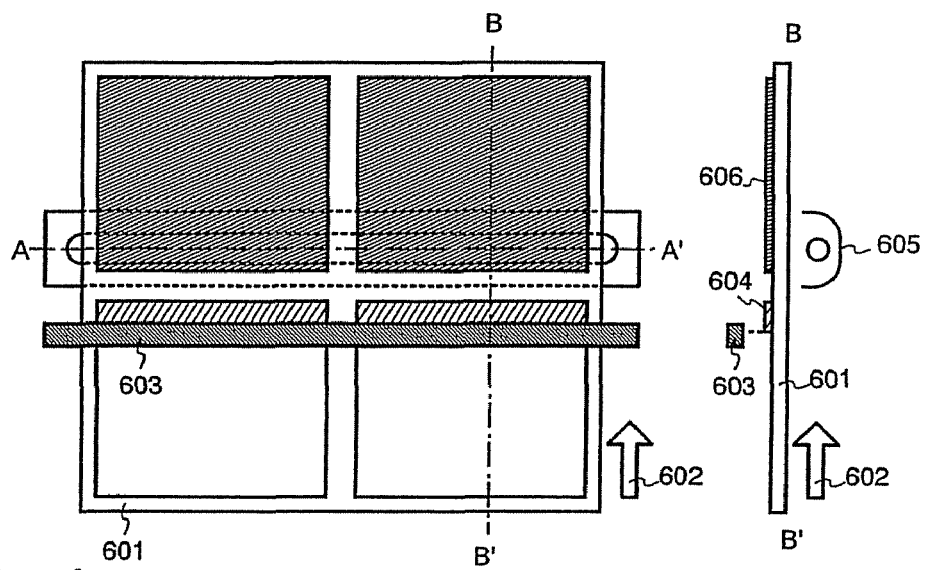
FIG. 5A
FIG. 5C
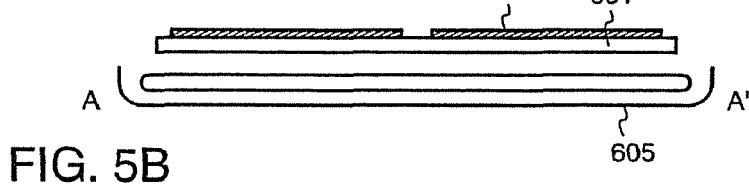
FIG. 5B

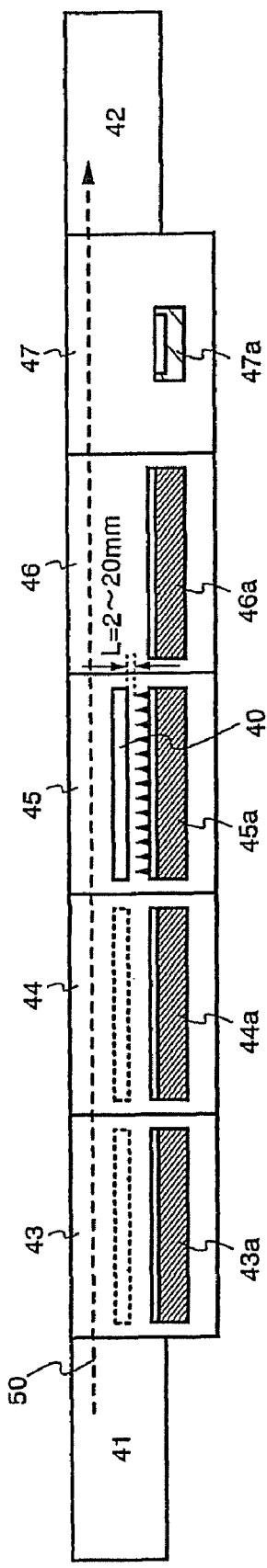
FIG. 9A TOP VIEW
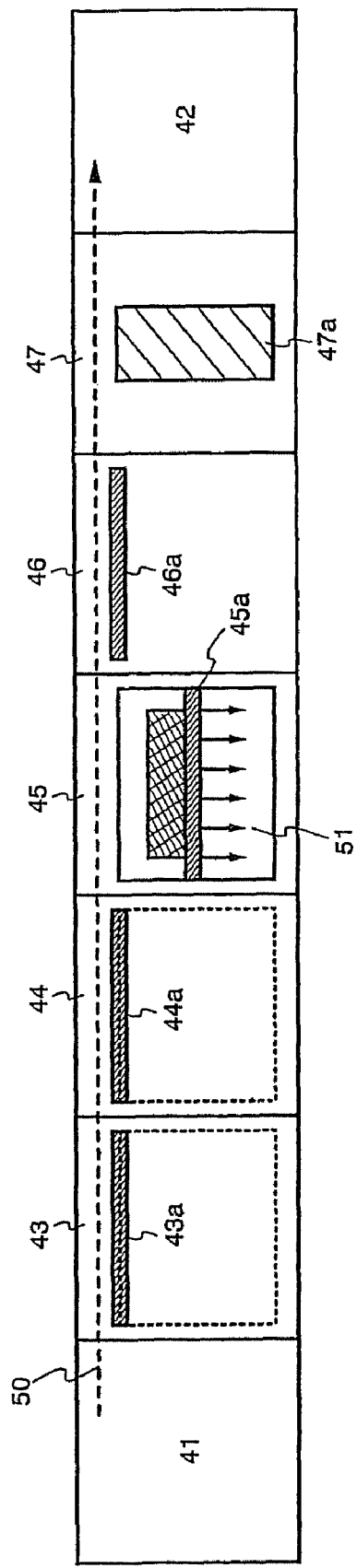
FIG. 9B SIDE VIEW VIEWED FROM FRONT SIDE

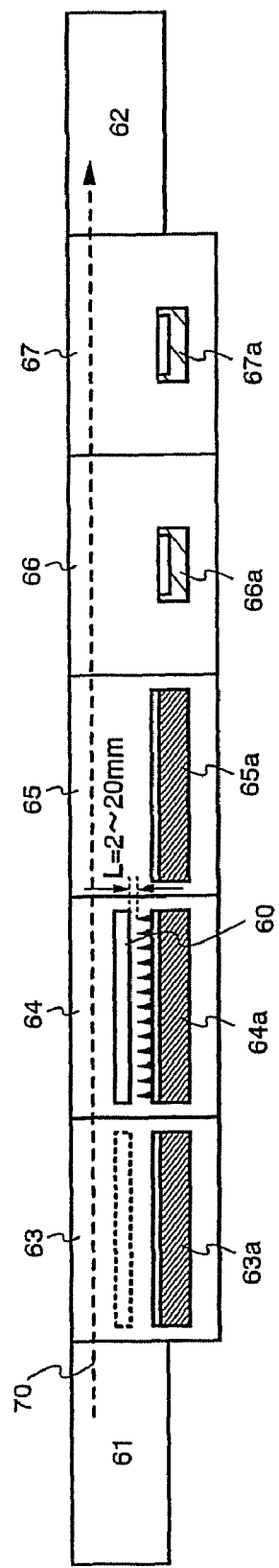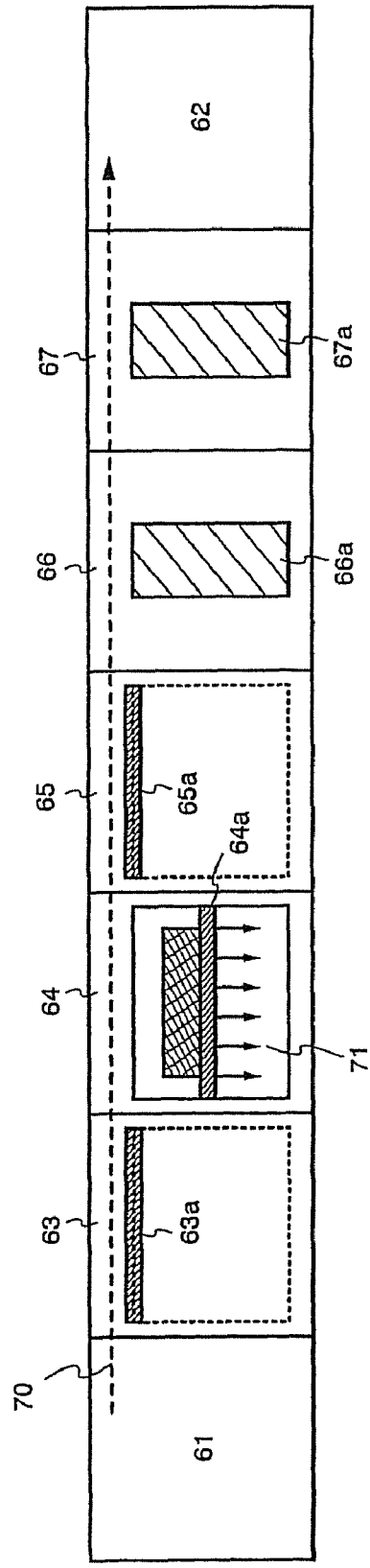
FIG. 10A TOP VIEW
FIG. 10B SIDE VIEW VIEWED FROM FRONT SIDE

GAS OBTAINED BY VOLATILIZING THE SOLVENT

GAS OBTAINED BY VOLATILIZING THE SOLVENT

GAS OBTAINED BY VOLATILIZING THE SOLVENT

METHOD OF MANUFACTURING LIGHT EMITTING DEVICE

This application is a continuation of U.S. application Ser. No. 11/652,284, filed on Jan. 11, 2007 now U.S. Pat. No. 7,569,405 issued Aug. 4, 2009 which is a continuation of U.S. application Ser. No. 11/036,299, filed on Jan. 14, 2005 (now U.S. Pat. No. 7,163,836 issued Jan. 16, 2007) which is a continuation of U.S. application Ser. No. 10/464,798, filed on Jun. 18, 2003 (now U.S. Pat. No. 6,858,464 issued Feb. 22, 2005).

BACKGROUND OF THE INVENTION

1. Field of the Invention

The present invention relates to a technical field concerning display devices (hereinafter referred to as light-emitting devices) comprising, on a substrate, an element (hereinafter referred to as a light-emitting element) having a structure comprising an anode, a cathode, and a thin film (hereinafter referred to as a light-emitting layer) sandwiched between the anode and the cathode to emit light relying upon a phenomenon called electroluminescence. The invention further relates to a technical field concerning an electronic device provided with the light-emitting device as an video display portion.

2. Description of the Related Art

In recent years, it has been urged to develop a light-emitting device referred to as an organic EL panel, an organic light-emitting diode (OLED) and the like as video displays. This is realized by generating a light-emitting phenomenon called electroluminescence by recombining holes and electrons in the light-emitting layer formed between an electrode (hereinafter referred to as an anode) for injecting holes and an electrode (hereinafter referred to as a cathode) for injecting electrons, and by controlling on/off of light emission to display images.

A thin organic film is mainly used as a light emitting layer used for the light-emitting device. An evaporation method had been a favored method for forming the thin organic film by using a low molecular weight material. At present further, however, a method has been vigorously developed for forming the light-emitting layer comprising a high molecular weight material used for the light-emitting device by applying a solution, such as by a spin-coating method, an ink jet method or a printing method. In particular, formation of a thin organic film by the ink jet method is already approaching a practicable level, and its basic technology has been disclosed in, for example, JP 10-012377.

The ink jet method is technology accomplished by applying the ink jet method that has heretofore been used in the printers to the formation of thin films, by using, instead of an ink, a solvent such as water or an alcohol in which is dissolved or dispersed a solute that is a material of the organic thin film, and applying a droplet solution to each of the pixels. As a matter of course, since a droplet solution attached onto pixels (which are pixel electrodes provided in the respective pixels, in fact) includes a lot of solvent ingredients, an additional step for vaporizing the solvent ingredients (hereinafter referred to as a step for firing) is required in order to remove the solvent ingredients. That is, after the droplet solution is applied by the ink jet method, each of the pixels is heated entirely to vaporize the solvent ingredients, thereby reducing the thickness of remaining solute (which is a material for an organic thin film).

Such step for firing is generally conducted in an electric heating furnace, therefore it causes a reduction of throughput. Further, it is hard to vaporize the solvent ingredients at low temperature, and when the solvent ingredients are remained in a thin film, the ingredients are vaporized with time to cause a degassing phenomenon, thereby causing deterioration of the organic thin film. Furthermore, deterioration of a light emitting element is caused. In addition, when heating temperature is increased in order to remove the solvent ingredients completely, the composition of the organic thin film that has low heat resistance is destroyed.

As set forth above, although the film formation method using the ink jet method has the advantage of being able to manufacturing a light emitting device at low cost, through a simple method and featuring a high throughput, the film formation method is a technique that leaves to be improved at a point in which the step for firing is necessary.

SUMMARY OF THE INVENTION

This invention was accomplished in view of the above problems, and provides a technique in which the step for firing is not necessary with respect to the method for forming a thin film by applying a solution. Furthermore, the present invention provides a method of manufacturing a light emitting device at low cost, through a simple method and featuring a high throughput by applying aforementioned technique to the formation of the light emitting device.

According to the present invention, it is characterized in that: a solution containing a light emitting material is ejected to a pixel electrode (anode or cathode) under reduced pressure; and the light-emitter composition is deposited on the pixel electrode to form at least a layer of a thin film which constitutes a light emitter. At this time, it may be that: a solvent in the solution is volatilized until the arrival of the solution at the pixel electrode; and the remaining light-emitter composition is deposited on the pixel electrode to form at least a layer of a thin film which constitutes a light emitter. Further, it may be that: the pixel electrode is previously heated (at a room temperature (typically 20° C.) to 300° C., preferably 50 to 200° C. in consideration of heat resistance of the light emitter) to thereby start volatilization of a solvent in the solution simultaneously with the arrival of the solution at the pixel electrode; and the remaining light-emitter composition is deposited on the pixel electrode to form at least a layer of a thin film which constitutes a light emitter. In any case, the characteristic of the present invention resides in a point that the solvent component is volatilized simultaneously with the formation of at least the layer of the thin film which constitutes the light emitter, which eliminates or shortens a burning step that has been required in the prior art.

In the present invention, the light emitter indicates an organic compound, inorganic compound, or laminate body which contributes to a carrier injecting layer (hole injecting layer or electron injecting layer), carrier transporting layer (hole transporting layer or electron transporting layer), carrier blocking layer (hole blocking layer or electron blocking layer), light emitting layer, and other recombination of carriers. Further, the light-emitter composition indicates a composition that serves as a material for the light emitter, and is comprised of either the organic compound or the inorganic compound. The light-emitter composition is roughly divided into a light emitting material and a carrier (hole or electron) transporting material.

The light emitting material is a material that causes a light emission phenomenon with electroluminescence through injection of holes and electrons. The above-described light emitting material is found in both the categories of inorganic compounds and organic compounds. However, it is preferable that the organic compound is used in the solution applying method as in the present invention. Further, as the light emitting material, a material that emits fluorescence through singlet excitation and a material that emits phosphorescence through triplet excitation may be used. In addition, the hole transporting material is a material with which holes move easily, and the electron transporting material is a material with which electrons move easily.

The reduced pressure indicates a pressure lower than an atmospheric pressure, and may be set at $1\times10^2$ to $2\times10^4$ Pa (preferably, $5\times10^2$ to $5\times10^3$ Pa) in an atmosphere filled with an inert gas such as nitrogen or rare gas (hereinafter, referred to as inert atmosphere) or set at 1 to $5\times10^4$ Pa ($1\times10^2$ to $1\times10^3$ Pa) in vacuum. By setting the reduced pressure, a solvent is always volatilized from a droplet until the droplet ejected in the atmosphere reaches the pixel electrode, and the volume of the droplet is gradually reduced. Then, most of the solvent has been volatilized at the point of time when the droplet reaches the pixel electrode, and the film formation is completed simultaneously with the arrival of the droplet. That is, this is superior to the prior art in a point that a heating step such as a burning step is not required after the solution application.

Further, a solvent with high volatility (that is, a solvent with a high vapor pressure) may be used in order to sufficiently volatilize the solvent before the arrival at the pixel electrode. This is because, although a period of time necessary for volatilization needs to be gained by lengthening the distance between the pixel electrode and an ejection opening (tip end portion of a nozzle) for the solution in the case of the solvent with low volatility, a ballistic error of the droplet is increased with the long distance. Alcohols such as methanol and ethanol are given as the solvents with high volatility.

Further, a solvent with a high boiling point is used instead of the solvent with high volatility, whereby there can be eliminated, for example, apprehension that drying of the droplet at the ejection opening causes clogging at the tip end of the nozzle. In this case, when the pixel electrode is previously heated (at a room temperature (typically, 20° C.) to 300° C., preferably 50 to 200° C. in consideration of heat resistance of the light emitter), volatilization is started simultaneously with the arrival of the droplet at the pixel electrode. Therefore, a burning step can be finished simultaneously with ejection of a droplet to another pixel. Of course, the solvent is always made to be volatilized from the droplet until the arrival of the droplet at the pixel electrode by the above-described method, and besides, the pixel electrode is previously heated, whereby further improvement in film quality can be attained.

As to the solvent with a high boiling point, NMP (N-methyl pyrrolidone), DMF (dimethylformamide), DMSO (dimethyl sulfoxide), HMPA (hexamethylphosphoramide), and other polar solvents may be used. Further, as the solvent with low polarity, there may be used an aromatic solvent like alkylbenzene (in particular, preferably long-chain alkylbenzene like dodecylbenzene) such as xylene. For example, there can be used a solvent in which tetralin and dodecylbenzene are mixed with each other in a 1:1 ratio.

Note that the present invention can be implemented for both the manufacture of a passive matrix light emitting device and the manufacture of an active matrix light emitting device, and there is no particular limitation placed on the form of the light emitting device. Further, not only an organic compound but also an inorganic compound can be applied to the light emitting material. In particular, the present invention is effective for the case where organic compounds are laminated because the burning step is not particularly required after the solution application.

BRIEF DESCRIPTION OF THE DRAWINGS

In the accompanying drawings:

FIG. 4 is a sectional view of a container for equipping the solution applying device used for implementing the present invention with a solution containing a light-emitter composition;

FIGS. 5A to 5C are views showing a method of manufacturing a light emitting device according to the present invention;

FIGS. 9A and 9B are a top view and a side view of a manufacturing device used for implementing the present invention, respectively;

FIGS. 10A and 10B are a top view and a side view of a manufacturing device used for implementing the present invention, respectively;

DETAILED DESCRIPTION OF THE PREFERRED EMBODIMENTS

Embodiment 1

Figure 1A:
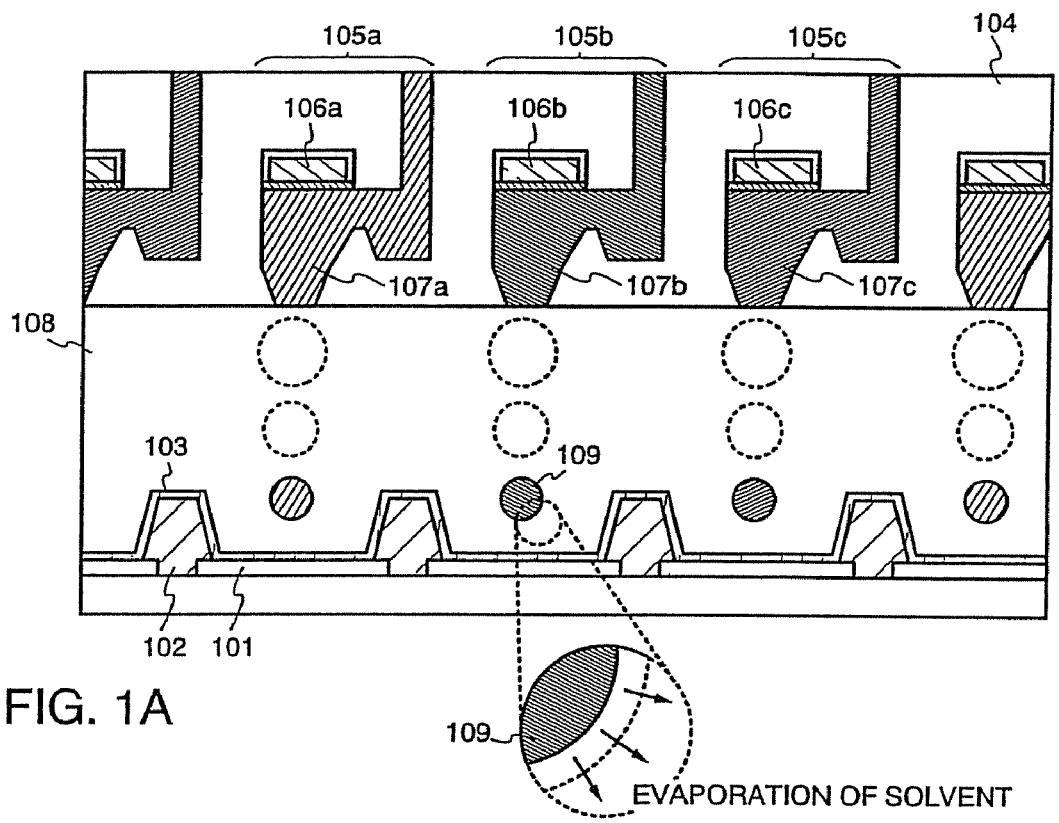
FIGS. 1A and 1B are sectional views of a solution applying device used for implementing the present invention.
Figure 1B:
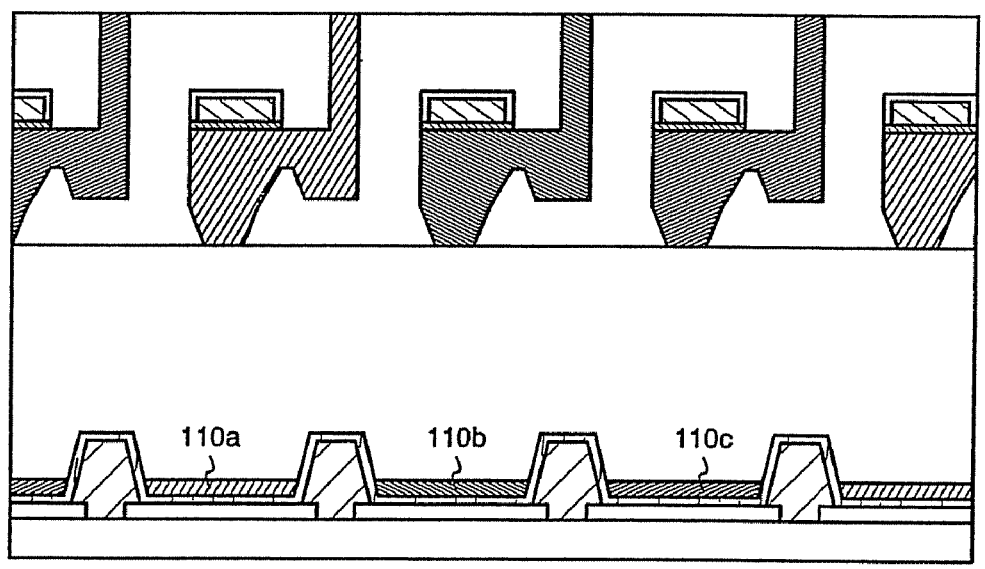

An embodiment of the present invention will be described with reference to FIGS. 1A and 13. FIG. 1A shows a state obtained immediately after a solution containing a light emitting material is ejected, and FIG. 1B shows a state in which, after the light emitting material reaches an anode or a cathode, a thin film (light emitting layer) is formed thereon.

In FIG. 1A, reference numeral 101 denotes an anode or a cathode; 102 denotes an insulator that defines each pixel; and 103 denotes a carrier injecting layer. The carrier injecting layer 103 is a hole injecting layer if 101 corresponds to the anode, or is an electron injecting layer if 101 corresponds to the cathode. Further, reference numeral 104 denotes an enlarged head portion in a device for performing application of a solution (hereinafter, referred to as solution applying device), and an internal structure of the head portion is partially shown. The head portion 104 includes plural ejection portions 105a to 105c each having a function of ejecting a solution containing a light emitting material. The ejection portions 105a to 105c are respectively provided with piezo-electric elements (piezo elements) 106a to 106c. Further, the ejection portions 105a to 105c are respectively filled with solutions 107a to 107c each containing the light emitting material.

Here, the solution 107a containing the light emitting material contains a light emitting material that emits red light, the solution 107b containing the light emitting material contains a light emitting material that emits green light, and the solution 107c containing the light emitting material contains a light emitting material that emits blue light. These three kinds of light emitting materials constitute a pixel that emits red light, a pixel that emits green light, and a pixel that emits blue light, respectively. These three pixels are treated as a pixel unit.

Note that only one ejection portion for each of R (red), G (green), and B (blue) is explained in FIG. 1A, but plural ejection portions (nozzles) can be arranged parallelly. Taking throughput into consideration, it is the most desirable that the ejection portions corresponding to the number of pixels for one row or column of a pixel portion are arranged.

Further, the most characteristic point in the present invention is that a space 108 between the head portion 104 and the anode or cathode 101 is maintained under reduced pressure, that is, at a pressure lower than an atmospheric pressure. Specifically, the pressure is $1 \times 10^2$ to $2 \times 10^4$ Pa (preferably, $5 \times 10^2$ to $5 \times 10^3$ Pa) in an inert atmosphere, and is 1 to $5 \times 10^4$ Pa ($1 \times 10^2$ to $1 \times 10^3$ Pa) in vacuum. The solutions 107a to 107c each containing the light emitting material, which are respectively filled in the ejection portions 105a to 105c, are pressurized by the change in volume of the respective piezoelectric elements 106a to 106c to thereby be pushed out, and then are ejected toward the pixel electrode 101. Then, a droplet 109, which has been ejected, travels while a solvent thereof is volatilized under reduced pressure, and the remaining light emitting material is deposited on the pixel electrode 101. As a result, the light emitting material is deposited intermittently.

The thin film deposited as described above is kept thin in a state in which the solvent component is sufficiently removed even if the solvent is not particularly volatilized by means of heating or the like. Thus, a light emitting layer is obtained which involves few problems of deterioration with time due to degassing and the like. With the above-described structure, a burning step or the like is not required even after the application of the solution, the throughput can be significantly improved, and also, deterioration of the light emitting material itself due to heating can be avoided. Note that, the characteristic of the present invention is that the burning step is not required. However, even in combination with a burning step such as heat treatment in vacuum, an effect of the present invention is not impaired that the light emitting layer with little degassing, in which the solvent component has been sufficiently removed, can be obtained.

Therefore, as shown in FIG. 1B, a light emitting layer 110a that emits red light, a light emitting layer 110b that emits green light, and a light emitting layer 110c that emits blue light are formed. Thereafter, a carrier transporting layer, a carrier injecting layer, and the like are formed as the occasion demands. Then, an opposing electrode (cathode against anode, anode against cathode) is provided. Consequently, a light emitting element is completed.

Embodiment 2

Figure 2A:
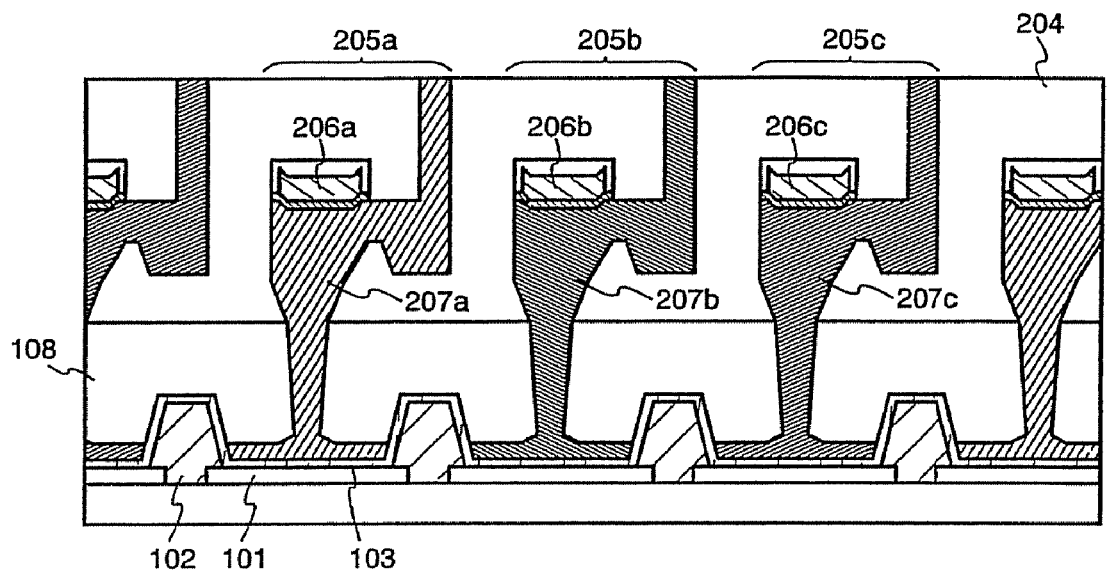
FIGS. 2A and 2B are sectional views of a solution applying device used for implementing the present invention.
Figure 2B:
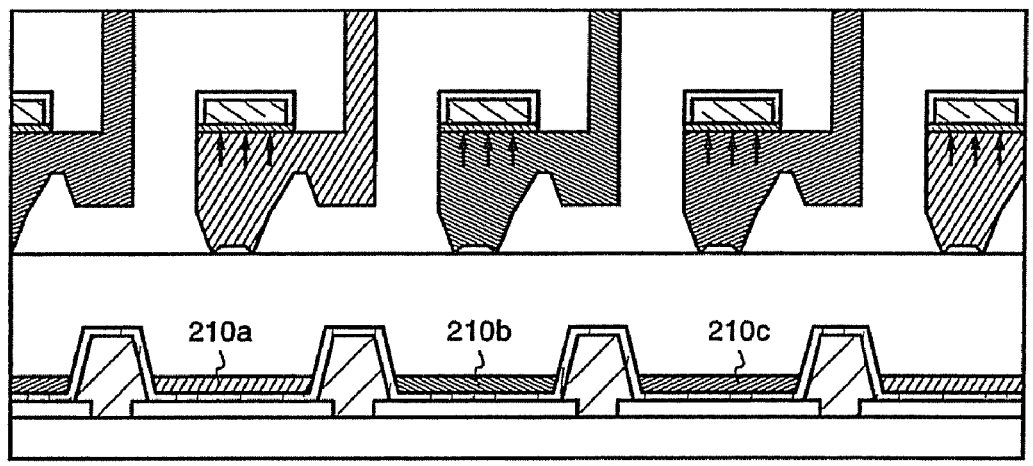

This embodiment gives an example in which: application of a solution is not performed through ejection of droplets; and a gel solution having viscosity to some extent is applied. FIG. 2A shows a state in which ejection of a solution containing a light emitting material is being performed, and FIG. 2B shows a state in which the ejection of the solution containing the light emitting material is stopped. Note that the description of Embodiment 1 may be referred to for the same reference symbols as those used in FIGS. 1A and 1B.

In this embodiment, as shown in FIG. 2A, a head portion 204 of a solution applying device includes plural ejection portions 205a to 205c each having a function of ejecting a light emitting material. The ejection portions 205a to 205c are respectively provided with piezoelectric elements (piezo elements) 206a to 206c. Further, the ejection portions 205a to 205c are respectively filled with solutions 207a to 207c each containing the light emitting material. At this time, similarly to FIG. 1A, the solution 207a containing the light emitting material contains a light emitting material that emits red light, the solution 207b containing the light emitting material contains a light emitting material that emits green light, and the solution 207c containing the light emitting material contains a light emitting material that emits blue light.

Incidentally, in this embodiment, the viscosity of the solutions 207a to 207c each containing the light emitting material is adjusted to a level higher than that of the viscosity of the solutions 107a to 107c each containing the light emitting material in Embodiment 1. The adjustment is performed in order that the solution containing the light emitting material is continuously applied. As a result, the light emitting material is continuously deposited. Further, as shown in FIG. 2A, when being applied, the solutions 207a to 207c each containing the light emitting material are pressurized by an inert gas such as nitrogen to be pushed out in a state in which the piezoelectric elements 206a to 206c are pushed downward.

Note that, as to the solutions 207a to 207c each containing the light emitting material, volatilization of a solvent in each solution starts immediately after the solution goes out of an ejection opening, the volume of the solution is gradually reduced, and finally, the solution reaches the pixel electrode 101. Most of the solvent has been volatilized at about the time the solution reaches the pixel electrode 101, and the remaining light emitting material is deposited, whereby a light emitting layer is formed. Of course, an atmosphere of the space 108 is maintained under reduced pressure as in Embodiment 1.

Further, as shown in FIG. 2B, when the application of the solutions 207a to 207c each containing the light emitting material is to be stopped, the pressurization with the inert gas is stopped, and also, the piezoelectric elements 206a to 206c are pushed upward (in an arrow direction). From this, the solution containing the light emitting material comes a little into an inner portion with respect to the ejection opening, and thus, drying of the solution can be avoided.

Further, the space 108 is kept in a solvent atmosphere at this time, whereby drying of the solutions 207a to 207c each containing the light emitting material at the ejection opening can also be avoided. In addition, the example is shown in which the solution is guided into the ejection opening by using each of the piezoelectric elements 206a to 206c in this embodiment. However, the same can also be realized by keeping the space 108 in a pressurized state.

As a result, as shown in FIG. 2B, a light emitting layer 210a that emits red light, a light emitting layer 210b that emits green light, and a light emitting layer 210c that emits blue light are formed. The light emitting layer thus formed is kept thin in a state in which the solvent component is sufficiently removed even if the solvent is not particularly volatilized by means of heating or the like. Thus, the light emitting layer is obtained which involves few problems of deterioration with time due to degassing and the like. With the above-described structure, a burning step or the like is not required even after the application of the solution, the throughput can be significantly improved, and also, deterioration of the light emitting material itself due to heating can be avoided.

Note that, the characteristic of the present invention is that the burning step is not required. However, even in combination with a burning step such as heat treatment in vacuum, an effect of the present invention is not impaired that the light emitting layer with little degassing, in which the solvent component has been sufficiently removed, can be obtained. Thereafter, a carrier transporting layer, a carrier injecting layer, and the like are formed as the occasion demands. Then, an opposing electrode (cathode against anode, anode against cathode) is provided. Consequently, a light emitting element is completed.

Further, the present invention can be implemented for both the manufacture of a passive matrix light emitting device and the manufacture of an active matrix light emitting device, and there is no particular limitation placed on the form of a light emitting device. Further, not only an organic compound but also an inorganic compound can be applied to the light emitting material. In particular, the present invention is effective for a case where organic compounds are laminated one on another since the burning step is not particularly required after the application of the solution.

Embodiment 3

Figure 3A:
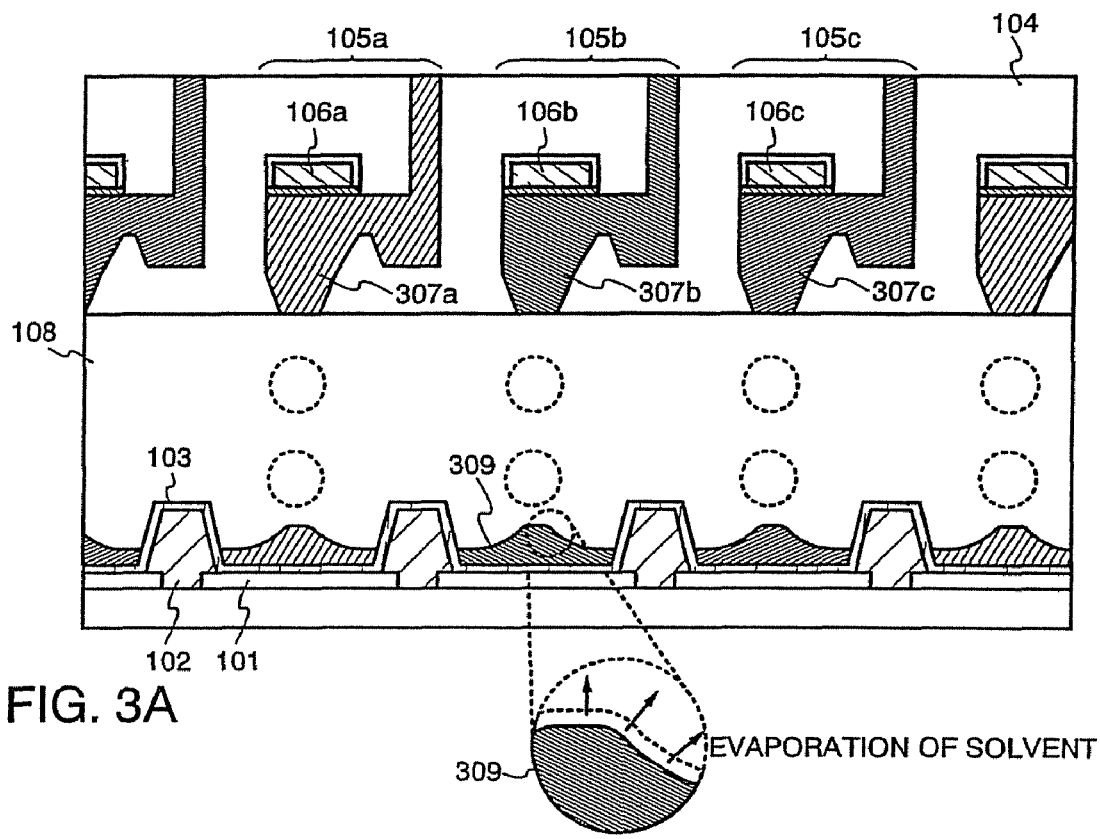
FIGS. 3A and 3B are sectional views of a solution applying device used for implementing the present invention.
Figure 3B:
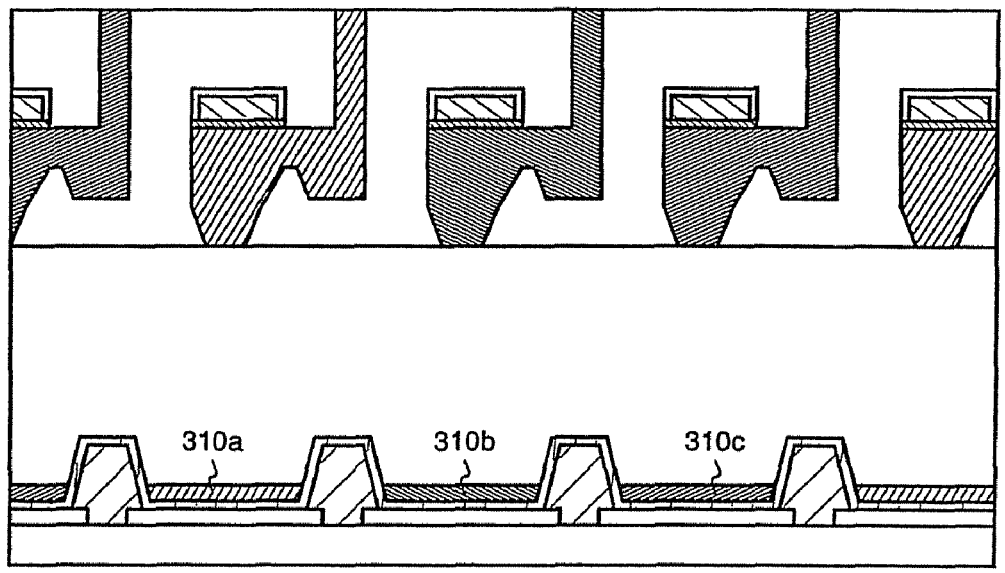

Another embodiment of the present invention will be described with reference to FIGS. 3A and 3B. FIG. 3A shows a state which is obtained immediately after the arrival, at an anode or cathode, of a droplet of an ejected solution containing a light emitting material, and FIG. 3B shows a state in which: the light emitting material is burned on the anode or cathode, as a result of which a thin film (light emitting layer) is formed thereon. Note that a solution applying device in FIGS. 3A and 3B is the same as that described with FIGS. 1A and 1B, and the description of Embodiment 1 may be referred to for the same reference symbols as those used in FIGS. 1A and 1B.

In FIG. 3A, the ejection portions 105a to 105c including the piezoelectric elements (piezo elements) 106a to 106c are filled with solutions 307a to 307c each containing a light emitting material, respectively. In the solutions 307a to 307c each containing the light emitting material, light emitting materials that respectively emit red light, green light, and blue light are used as dissolved substances, and a solvent having a high boiling point is used (Incidentally, a solvent, which is volatilized at a room temperature (typically, 20° C.) to 300° C., preferably 50 to 200° C., is preferable). Therefore, the solutions 307a to 307c each containing the light emitting material are extremely difficult to dry.

The solutions 307a to 307c each containing the light emitting material are pushed out by the piezoelectric elements 106a to 106c to be ejected from the plural ejection portions 105a to 105c. Reference numeral 309 denotes a pool obtained immediately after the solution reaches the anode or cathode 101. Of course, the space 108 between the head portion 104 and the anode or cathode 101 is maintained under reduced pressure, that is, at a pressure lower than an atmospheric pressure. Specifically, the pressure is $1\times10^2$ to $2\times10^4$ Pa (preferably, $5\times10^2$ to $5\times10^3$ Pa) in an inert atmosphere, and is 1 to $5\times10^4$ Pa ($1\times10^2$ to $1\times10^3$ Pa) in vacuum.

At this time, the anode or cathode 101 is heated at a room temperature (typically 20° C.) to 300° C., preferably 50 to 200° C. As to the pool 309 obtained immediately after the arrival of the solution at the anode or cathode 101, volatilization of the solvent is started from the point of time of the arrival. Note that, although the description is made only for pixels for one line in FIG. 3A, pixels for plural lines are arranged parallelly in an actual pixel portion, and the solutions 307a to 307c each containing the light emitting material are ejected sequentially to the respective pixels. Therefore, a fixed time is needed for application to all the pixels. In this embodiment, a burning step is completed by making use of the fixed time.

The burning step is substantially completed for the deposited thin film at the point of time when the application to the whole pixel portion is ended. A process time can be significantly reduced compared with a conventional method although the burning step itself is performed. Thus, as shown in FIG. 3B, a light emitting layer 310a that emits red light, a light emitting layer 310b that emits green light, and a light emitting layer 310c that emits blue light are formed. Thereafter, a carrier transporting layer, a carrier injecting layer, and the like are formed as the occasion demands. Then, an opposing electrode (cathode against anode, anode against cathode) is provided. Consequently, a light emitting element is completed.

Note that the same effect of the structure in this embodiment, in which the whole pixel portion that becomes a portion to be formed is heated in the application of the solution containing the light emitting material prepared with the solvent having a high boiling point by the ink jet method, can be obtained also when being applied to the solution applying devices with the structures of both Embodiment 1 and Embodiment 2.

Embodiment 4

This embodiment will describe a technology for filling a solution containing the light-emitter composition shown in Embodiments 1 and 2 without exposing it to the open air when the solution is filling in a head portion.

FIG. 4 is a sectional view of a container (canister) for preserving (storing) the solution containing the light-emitter composition in the solution applying device. It is desired that the container 351 is made from a material having airtightness and, particularly, having a sufficiently large resistance against the permeation of oxygen and moisture and is, desirably, made from a stainless steel or aluminum. It is further desired that the inner surfaces thereof are finished like a mirror surface. As required, further, the inner surfaces and/or the outer surfaces thereof may be coated with a silicon nitride film, a diamond-like carbon film or any other insulating film permitting oxygen to pass through little. This is to prevent the solution 352 containing the light-emitter composition in the container 351 from being deteriorated.

Reference numeral 353 denotes an inlet port for introducing nitrogen, a rare gas or any other inert gas into the container 351, and through which the inert gas is introduced to pressurize the interior of the container. Reference numeral 354 denotes an outlet port from where the solution 352 containing the light-emitter composition that is pressurized is sent into the head portion of the solution applying device (not shown in the figure). The inlet port 353 and the outlet port 354 may be formed of a material different from that of the container 351, or may be formed integrally therewith.

Reference numeral 356 denotes an inlet pipe coupled to the inlet port 353. To practically introduce the inert gas, an end of the inlet pipe 356 is coupled to the inlet port 353 to thereby introduce the inert gas. Similarly, an end of the outlet pipe 357 is coupled to the outlet port 354 to drain the solution 352 containing the light-emitter composition. In the drawing, the pipes are expressed as dotted lines since they are detachable.

For example, each of the head portions shown in embodiments 1 and 2 is attached to an extended end of the outlet pipe 357. In the case of Embodiment 1, the piezoelectric elements 106a to 106c are oscillated in a state where the interior of the container 351 is pressurized with the inert gas, so that the solution 352 containing the light-emitter composition is blown out intermittently. In the case of Embodiment 2, the solution can be continuously applied so far as the interior of the container 351 is being pressurized with the inert gas. When the application of pressure is discontinued, the solution 352 containing the light-emitter composition ceases to blow out.

In this embodiment, further, the feature resides in that the solution 352 containing the light-emitter composition is transported in a state of being kept off the atmosphere at all times from when it is introduced into the container 351 until when the container 351 is attached to the solution applying device. That is, the manufacturer of the solution 352 containing the light-emitter composition introduces the solution 352 containing the light-emitter composition into the container 351, transports it maintaining air-tightness without exposing it to the atmosphere, so as to be directly supplied to the solution applying device. This is done in view of that the light-emitter composition has weak resistance against oxygen and moisture and is easily deteriorated. After the light-emitter composition is refined, the purity of the light-emitter composition can be preserved until it is applied, thereby contributing to suppressing the deterioration of the light-emitter composition and maintaining improved reliability of the light-emitting device.

The container of the embodiment shown in FIG. 4 is only a preferred example for transporting the solution containing the light-emitter composition maintaining the purity thereof, but is not to limit the container that can be used in the invention.

Embodiment 5

In this embodiment, a feature resides in the use of light of a long wavelength region as means for heating entire pixel portions of Embodiments 3. The constitution of this embodiment will now be described with reference to FIGS. 5A to 5C. FIG. 5A is a top view of the heating method according to this embodiment, FIG. 5B is a sectional view cut along a line A-A', and FIG. 5C is a sectional view cut along a line B-B'.

In FIG. 5A, reference numeral 601 is a substrate which permits the transmission of light having wavelengths at least longer than those of visible rays (typically, light having wavelengths longer than 300 nm) and on which thin-film transistors and pixel electrodes are formed. The substrate 601 is conveyed by a conveyer mechanism that is not shown in a direction of an arrow 602.

A head portion 603 of the solution applying device is installed over the front surface of the substrate 601, and the solution containing the light-emitter composition is applied in a manner as described in embodiments 1 to 3. The light-emitter composition 604 that is applied is heated by light (hereinafter referred to as lamp light) emitted from a lamp 605 installed under the back surface side of the substrate 601, whereby the solvent is volatilized (fired) to form a light emitter 606. That is, the light-emitter composition 604 that is applied is fired successively by lamp light to assume the form of a thin film.

Namely, due to the motion of the substrate 601, the head portion 603 and the lamp 605 are relatively scanned in a direction opposite to the direction in which the substrate 601 moves. It is allowable to secure the substrate 601 and to move the head portion 603 and the lamp 605, as a matter of course.

In this case, the head portion 603 is set to be scanned, first, at all times. As a result, the application of the solution by the head portion 603 and the subsequent firing by lamp light are effected nearly simultaneously, offering an advantage which is substantially equal to omitting the step of firing.

Light that can be used as lamp light has a wavelength which effects the heating only without destroying the composition of the light emitter 606. Concretely speaking, it is desired that light has a wavelength longer than 400 nm, i.e., has a wavelength longer than that of infrared rays. For example, there can be used electromagnetic waves over a wavelength region of from 1 µm up to 10 cm, which is from far ultraviolet rays through up to microwaves. It is particularly desired to use far ultraviolet rays (typically, wavelengths of from 4 to 25 µm) even from the standpoint of handling.

The embodiment here has dealt with an example of completing the application over the whole surface by simply scanning the head portion 603 only one time. It is, however, also allowable to reciprocally move the substrate 601 a plural number of times to apply the solution in an overlapped manner a plural number of times, followed by the scanning with the lamp 605. In this case, the lamp 605 is maintained turned off while the head portion 603 is scanning for the first several times and, then, the lamp 605 is energized to emit light to effect the scanning in synchronism with the last scanning of the head portion 603.

Upon the irradiation with light of a wavelength longer than those of infrared rays by using a source of light such as a lamp as heating means in the step of firing, it is made possible to apply the light-emitter composition and to fire the light-emitter composition almost at the same time to establish a system from which the step of firing is substantially omitted. This improves the throughput of the step of producing light-emitting devices.

Embodiment 6

As the light emitters described in Embodiments 1 to 5, there can be exemplified a light-emitting layer, a hole injecting layer, a hole transporting layer, a hole-blocking layer, an electron injecting layer, an electron-transporting layer, an electron-blocking layer, or a stacked layer thereof, which may be constituted by organic compounds only or a composite of a lamination of an organic compound and an inorganic compound.

Accordingly, this embodiment deals with an example of using a composite of an organic compound and an inorganic compound as a light emitter in the light-emitting device of the invention. U.S. Pat. No. 5,895,932 discloses a hybrid structure obtained by laminating organic compounds and inorganic compounds. Namely, this patent discloses technology according to which $Alq_3$ (tris-8-quinolinolatoaluminum complex) which is an organic compound is irradiated with ultraviolet light (wavelength of 380 nm) emitted from a diode of an inorganic compound to take out light emitted due to a phenomenon called photoluminescence. This technical idea is radically different from that of the light emitter or composite described in this embodiment.

Among the organic compounds, a high-molecular organic compound (hereinafter referred to as an organic polymer) has a high heat resistance, is easy to handle, and is used as a solute in the method of forming a film by applying a solution. This embodiment deals with the use of a composite of these organic polymer and inorganic compound as a light emitter.

The light emitters can be formed by laminating an organic polymer and an inorganic compound according to the following four typical patterns:

(a) a combination of a hole injecting layer (or a hole transporting layer) of an inorganic compound and a light-emitting layer of an organic polymer;
(b) a combination of an electron injecting layer (or an electron-transporting layer) of an inorganic compound and a light-emitting layer of an organic polymer;
(c) a combination of a light-emitting layer of an inorganic compound and a hole injecting layer (or a hole transporting layer) of an organic polymer; and
(d) a combination of a light-emitting layer of an inorganic compound and an electron injecting layer (or an electron-transportation layer) of an organic polymer.

Further, the light emitters can be formed by mixing an organic polymer and an inorganic compound according to the following three typical patterns:
(e) a combination of a light-emitting layer of an organic polymer having carrier-transporting property and the organic polymer in which an inorganic compound is mixed;
(f) a mixture of an organic polymer having carrier-transporting property of the same polarity (n-type or p-type) and an inorganic compound as a light-emitting layer; and
(g) a mixture of an organic polymer having carrier-transporting property and an inorganic compound having carrier-accepting property.

The above constitution (g) may be a combination of, for example, an organic polymer having a hole-transporting property in which is mixed an inorganic compound having electron-accepting property. In this case, the inorganic compound having electron-accepting property works to receive electrons from the organic polymer, whence holes are generated in the organic polymer, and the holes are transported thereby to create transporting property.

In the above constitutions (a) to (g), a p-type semiconductor material such as NiO (nickel oxide) can be used as the hole injecting layer or the hole transporting layer of the inorganic compound, an n-type semiconductor material such as ZnO (zinc oxide) or $TiO_2$ (titanium dioxide) can be used as the electron injecting layer or the electron-transporting layer of the inorganic compound, and ZnS (zinc sulfide) or CdS (cadmium sulfide) can be used as the light-emitting layer of the inorganic compound.

In the above constitution (b), for example, a PPV (polyparaphenylene vinylene) is used as the organic polymer, CdS is used as the inorganic compound, and these components are formed by applying the solution thereof. In forming CdS, in this case, fine particles of CdS of the order of nanometers (fine particles of from several nm to several tens of nm, hereinafter the same) are applied being dispersed in a solvent. The application step of this invention may be put into practice in this case. It is also allowable to use the n-type semiconductor material such as ZnO or $TiO_2$ instead of CdS or to use the p-type semiconductor material such as NiO.

In the above constitution (e), for example, a PVK (polyvinylcarbazole) is used as the organic polymer, CdS is used as the inorganic compound, and these components are formed by applying the solution thereof. In this case, the CdS serves as a center of emitting light. In forming CdS, fine particles of CdS are applied being dispersed in a solvent. The application step of this invention may be put into practice in this case. It is also allowable to use an inorganic compound such as ZnS instead of CdS. The CdS and ZnS are inorganic compounds which easily form fine particles of the order of nanometers, and are very desirable materials when it is a prerequisite to apply a solution thereof as in this invention.

In the above constitution (g), further, a PC (polycarbonate) is used as the organic polymer, a TPD (triphenyldiamine) which is a hole transporting inorganic compound and an alkoxide of Ti are mixed into the PC so as to be applied in the form of a solution. Then, the light emitter of a mixture of PC, TPD and $TiO_2$ is formed by the hydrolysis and vacuum heating. In forming CdS, in this case, fine particles of CdS are applied being dispersed in a solvent. The application step of this invention may be put into practice in this case.

By using various organic compounds and inorganic compounds, as described above, it is made possible to prepare a composite light emitter by employing the production method of this invention.

The light emitter (composite) of this embodiment can be prepared by any one of the methods of Embodiments 1 to 3 and Embodiment 5, and can be preserved even by using the container of Embodiment 4.

Embodiment 7

Figure 6A:
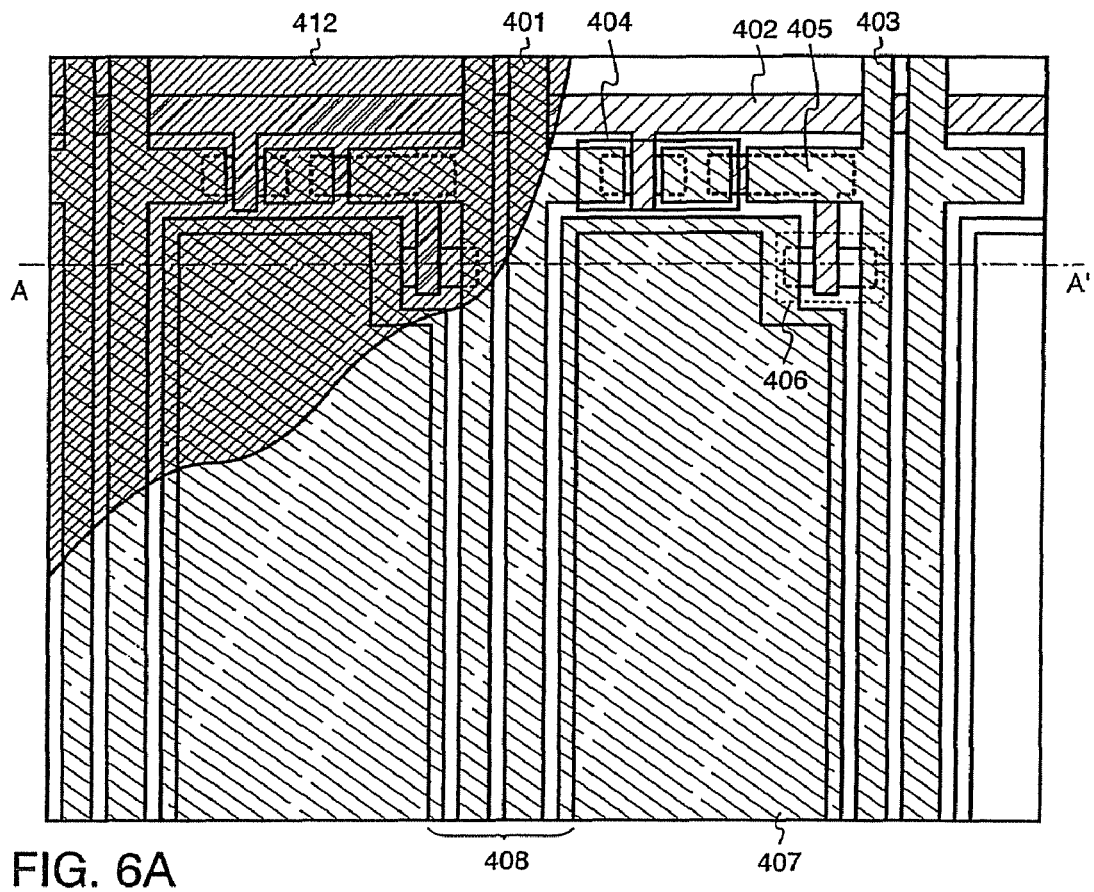
FIGS. 6A and 6B are a top view and a sectional view each of which shows a pixel structure of a light emitting device obtained by implementing the present invention, respectively.

This embodiment deals with a light-emitting device produced by putting the invention into practice, and is described with reference to FIG. 6. In the pixel constitution shown in FIG. 6A, reference numeral 401 denotes a data signal line, 402 denotes a gate signal line, 403 denotes a power source line, 404 denotes a thin-film transistor for switching (also referred to as a switching TFT, the same holds hereinafter), 405 denotes a capacitor for holding electric charge, 406 denotes a thin-film drive transistor (referred to as drive TFT, the same holds hereinafter) for feeding a current to the light-emitting element, and 407 denotes a pixel electrode connected to the drain of the drive TFT, the pixel electrode 407 serving as an anode of the light-emitting element. Further, reference numeral 412 is an opposing electrode which serves as a cathode of the light-emitting element.

Figure 6B:
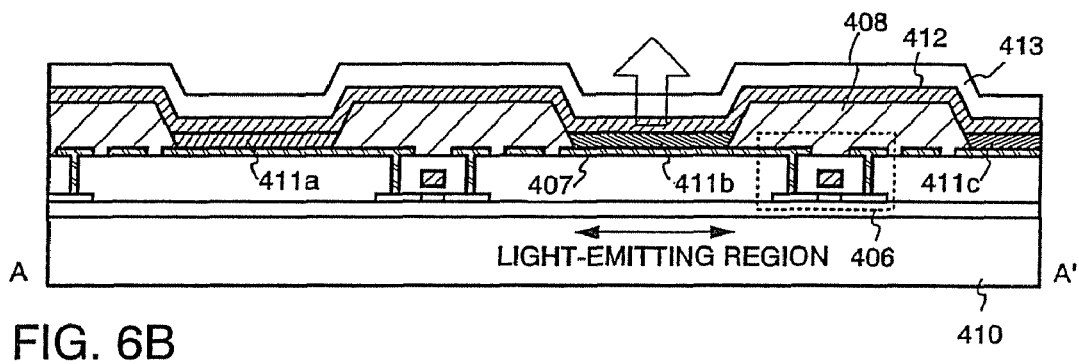

FIG. 6B is a sectional view along A-A'. In FIG. 6B, reference numeral 410 denotes a substrate which may be a glass substrate, a quartz substrate, a plastic substrate or any other light-transmitting substrate. The drive TFT 406 is formed on the substrate 410 relying upon a semiconductor process. Further, an insulator 408 patterned like a lattice is formed so as to cover an end of the pixel electrode 407 that is so formed as to be connected to the drive TFT 406, and to cover at least the drive TFT and the switching TFT.

On the pixel electrodes 407 are formed light emitters 411a to 411c, an opposing electrode 412 serving as a cathode, and a passivation film 413. The light emitters 411a to 411c stand for a carrier injecting layer, a carrier-transporting layer, a carrier-blocking layer, a light-emitting layer, or any other organic compound or inorganic compound that contributes to recombining carriers, or a laminate thereof. The laminated structure and materials of these light emitters 411a to 411c may be the known constitution and materials.

For example, there may be included an inorganic hole injecting layer (which other wise may be referred to as an inorganic hole transporting layer) having a high resistance (resistivity of from 1 to $1\times10^{11}\Omega$ cm) as at least one layer of the light emitter as disclosed in JP 2000-268967 and JP 2000-294375. The inorganic hole injecting layer contains, as first components, alkali metal elements selected from Li, Na, K, Rb, Cs and Fr, or alkaline earth metal elements selected from Mg, Ca and Sr, or lanthanide-type elements selected from La and Ce, and contains, as second components, the elements selected from Zn, Sn, V, Ru, Sm and In. As at least one layer of the light emitter, further, there may be included an inorganic electron-transporting layer having a high resistance (resistivity of 1 to $1\times10^{11}\Omega$ cm). The inorganic hole injecting layer contains metal elements selected from Au, Cu, Fe, Ni, Ru, Sn, Cr, Ir, Nb, Pt, W, Mo, Ta, Pd and Co or oxides, carbides, nitrides, silicates or borates thereof. Further, main component of the inorganic hole injecting layer may be an oxide of silicon, germanium or silicon germanium. By using a stable inorganic insulating film as part of the light emitter as described above, reliability of the light-emitting element can be enhanced.

As the opposing electrode 412, further, there can be used an aluminum film containing an element belonging to the Group 1 or Group 2 of periodic table or a thin silver film. In this embodiment, light emitted from the light emitters 411a to 411c must be transmitted and, hence, the film thickness is desirably not larger than 50 nm. As the passivation film 413, further, there can be used a silicon nitride film, an aluminum nitride film, a diamond-like carbon film or an insulating film exhibiting high blocking property against moisture and oxygen.

In producing the light-emitting device of the above constitution, the present invention makes it possible to produce the light-emitting device at a low cost, through a simple method and featuring a high throughput, as well as to improve reliability of the light-emitting device.

Embodiment 8

Figure 7A:
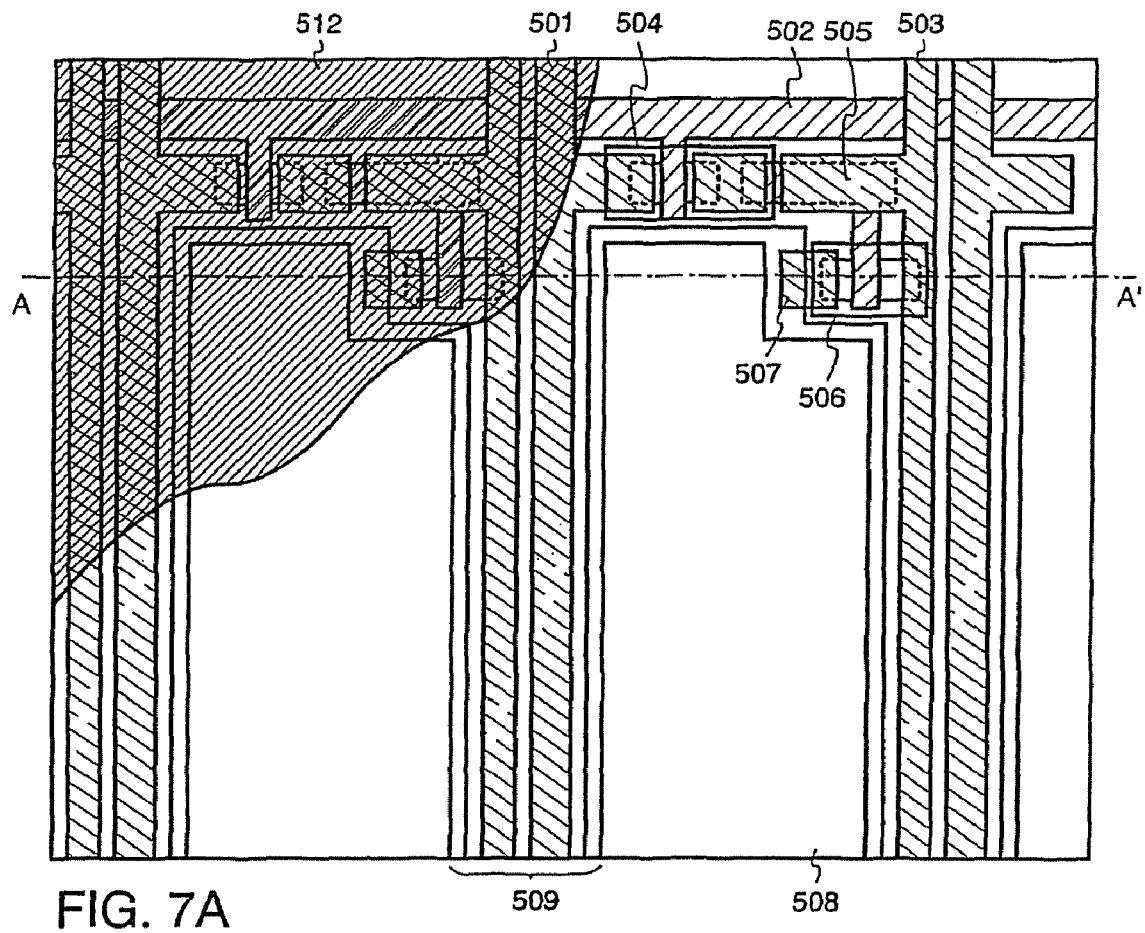
FIGS. 7A and 7B are a top view and a sectional view each of which shows a pixel structure of a light emitting device obtained by implementing the present invention, respectively.

This embodiment deals with a light-emitting device produced by putting the invention into practice, and is described with reference to FIGS. 7A and 7B. In the pixel constitution shown in FIG. 7A, reference numeral 501 denotes a data signal line, 502 denotes a gate signal line, 503 denotes a power source line, 504 denotes a switching TFT, 505 denotes a capacitor for holding electric charge, 506 denotes a drive TFT, 507 denotes a drain electrode of the drive TFT, and 508 denotes a pixel electrode connected to the drain electrode of the drive TFT, the pixel electrode 508 serving as an anode of the light-emitting element. It is desired that the pixel electrode 508 is formed of a conductive film which is transparent for the visible rays so that light emitted from the light emitter passes therethrough and is, hence, formed of an oxide conductive film such as of an ITO (a compound of indium oxide and tin oxide) or a compound of indium oxide and zinc oxide. Further, reference numeral 512 is an opposing electrode which serves as a cathode of the light-emitting element.

Figure 7B:
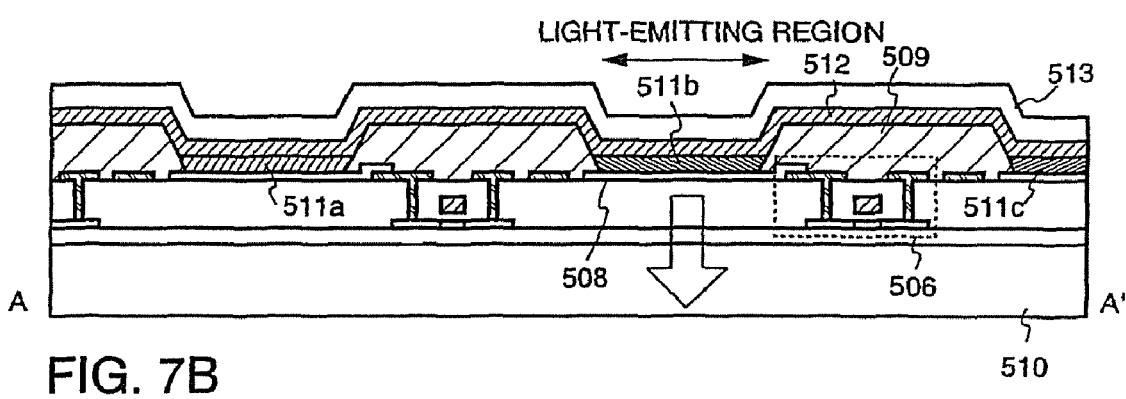

FIG. 7B is a sectional view along A-A'. In FIG. 7B, reference numeral 510 denotes a substrate which may be a glass substrate, a quartz substrate, a plastic substrate or any other light-transmitting substrate. The drive TFT 506 is formed on the substrate 510 relying upon a semiconductor process. Further, an insulator 509 patterned like a lattice is formed so as to cover an end of the pixel electrode 508 that is so formed as to be connected to the drive TFT 506, and to cover at least the drive TFT and the switching TFT.

On the pixel electrodes 508 are formed light emitters 511a to 511c, an opposing electrode 512 serving as a cathode, and a passivation film 513. The light emitters 511a to 511c stand for a carrier injecting layer, a carrier-transporting layer, a carrier-blocking layer, a light-emitting layer, or any other organic compound or inorganic compound that contributes to recombining carriers, or a laminate thereof. The laminated structure and materials of these light emitters 511a to 511c may be the known constitution and materials.

For example, there may be included an inorganic hole injecting layer (which otherwise may be referred to as an inorganic hole transporting layer) having a high resistance (resistivity of from 1 to $1 \times 10^{11} \Omega$ cm) as at least one layer of the light emitter as disclosed in JP 2000-268967 and JP 2000-294375. The inorganic hole injecting layer contains, as first components, alkali metal elements selected from Li, Na, K, Rb, Cs and Fr, or alkaline earth metal elements selected from Mg, Ca and Sr, or lanthanide-type elements selected from La and Ce, and contains, as second components, the elements selected from Zn, Sn, V, Ru, Sm and In. As at least one layer of the light emitter, further, there may be included an inorganic electron-transporting layer having a high resistance (resistivity of from 1 to $1 \times 10^{11} \Omega$ cm). The inorganic hole injecting layer contains metal elements selected from Au, Cu, Fe, Ni, Ru, Sn, Cr, Ir, Nb, Pt, W, Mo, Ta, Pd and Co or oxides, carbides, nitrides, silicates or borates thereof. Further, main component of the inorganic hole injecting layer may be an oxide of silicon, germanium or silicon germanium. By using a stable inorganic insulating film as part of the light emitter as described above, reliability of the light-emitting element can be enhanced.

As the opposing electrode 512, further, there can be used an aluminum film or a thin silver film containing an element belonging to the Group 1 or Group 2 of periodic table. As the passivation film 513, further, there can be used a silicon nitride film, an aluminum nitride film, a diamond-like carbon film or an insulating film exhibiting high blocking property against moisture and oxygen.

In producing the light-emitting device of the above constitution, the present invention makes it possible to produce the light-emitting device at a low cost, through a simple method and featuring a high throughput, as well as to improve reliability of the light-emitting device.

Embodiment 9

Figure 8:
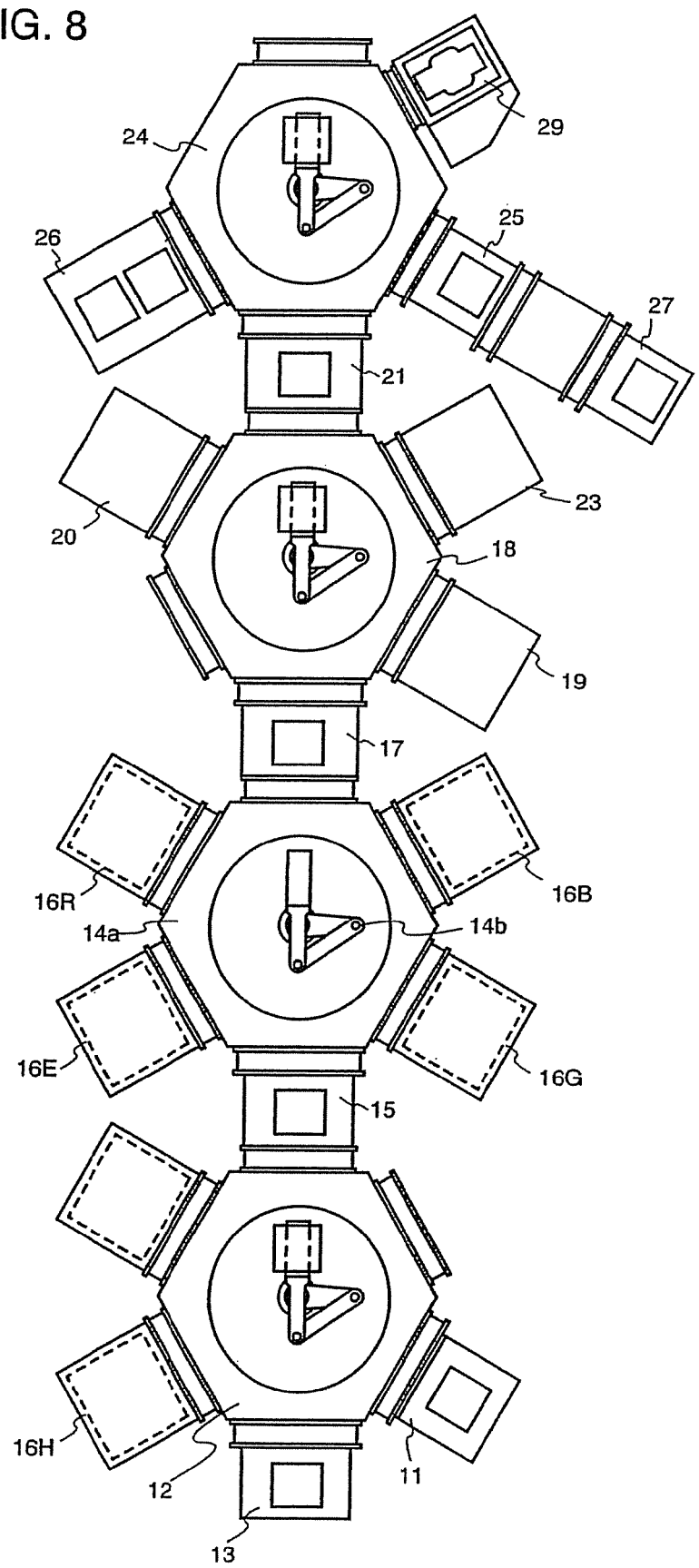
FIG. 8 is a top view of a manufacturing device used for implementing the present invention.

In this embodiment, FIG. 8 shows an example of a multi-chamber type manufacturing device in which the steps of the formation of a light emitter up through sealing of a light emitting element are automated. In FIG. 8, reference numeral 11 denotes a preparation chamber of a substrate to be accepted; 12, 14a, 18, and 24 each denote a conveying chamber for conveying a substrate to be processed (also referred to as common chamber); 15, 17, and 21 each denote a delivery chamber for performing delivery of a substrate between the conveying chambers; and 29 denotes a taking-out chamber of a processed substrate. In addition, reference numeral 13 denotes a pre-processing chamber, in which cleaning of an electrode surface or adjustment of a work function is previously performed before the formation of the light emitter.

Further, reference symbols 16R, 16G, and 16B each denote a film forming chamber for a light emitting layer corresponding to red color, green color, or blue color; 16H denotes a film forming chamber for a hole injecting layer (HIL) or hole transporting layer (HTL); and 16E denotes a film forming chamber for an electron injecting layer (EIL) or electron transporting layer (ETL). The present invention can be implemented by providing the solution applying device, which is the characteristic of the present invention, to one or plural of the above film forming chambers. Note that a film forming chamber for spin coating may be separately provided in the case where a spin coating method needs to be used for forming the hole injecting layer, hole transporting layer, electron injecting layer, or electron transporting layer.

Further, reference numeral 19 denotes a film forming chamber for an oxide conductive film; 20 denotes a film forming chamber for a metal film that becomes a cathode; and 23 denotes a film forming chamber for an insulating film that is used as a passivation film. The film forming chamber 20 is desirably a film forming chamber with a sputtering method although it may be a film forming chamber with an evaporation method, since there is apprehension that a TFT and a light emitting material are deteriorated due to radial rays such as X-rays and electron beam in the case of evaporation.

Further, reference numeral 27 denotes a sealing substrate load chamber for stocking a sealing substrate for sealing; 25 denotes a dispenser chamber for forming a sealing material; and 26 denotes a sealing chamber for sealing a light emitting element through bonding of a substrate to be processed and a sealing substrate. Since the manufacturing device shown in this embodiment is provided with the above sealing chamber and the like, sealing can be performed without the light emitting element being exposed to an atmosphere at all. Thus, there is provided an effective structure in realizing a light emitting device with high reliability.

In the manufacturing device in FIG. 8, the respective chambers are partitioned by gate valves, and can be airtightly cut off from one another. Further, each of the chambers is coupled with a vacuum exhaust pump. Thus, vacuum can be maintained, and also, a reduced pressure atmosphere is kept through introduction of an inert gas in each chamber. As the vacuum exhaust pump, a magnetic levitation turbo molecular pump, cryo pump, or dry pump can be used. Further, it is desirable that the inert gas to be introduced is sufficiently purified at a high level by means of a refiner or the like in advance.

Note that the structure of the manufacturing device shown in FIG. 8 is merely an example, and does not limit the present invention at all. This embodiment shows that the solution applying device for implementing the method of manufacturing a light emitting device according to the present invention can be combined with the multi-chamber type manufacturing device. This embodiment can also be implemented in combination with any structure of Embodiments 1 to 8 in the case of manufacturing a light emitting device.

Embodiment 10

In this embodiment, FIGS. 9A and 9B show an example in which the solution applying device used in implementing the present invention is combined with an in-line type manufacturing device in which the steps of the formation of a light emitter up through the formation of a cathode are performed. Note that FIG. 9A is a top view, and FIG. 9B is a side view.

In FIGS. 9A and 9B, reference numeral 41 denotes a load chamber for carrying in a substrate; 42 denotes an unload chamber for taking out a substrate; 43 denotes a film forming chamber for forming a hole injecting layer; 44 denotes a film forming chamber for forming a hole transporting layer; 45 denotes a film forming chamber for forming a light emitting layer; 46 denotes a film forming chamber for forming an electron injecting layer; and 47 denotes a film forming chamber for forming a metal film that becomes a cathode. An arrow 50 in the figure denotes a conveying direction of a substrate 40, and the substrate that has been already processed is expressed by dotted lines. At this time, the substrate 40 is conveyed in the state of being upright, that is, in the state in which a surface (surface to be processed) thereof is in parallel with a gravitational direction.

The film forming chambers 43 to 46 are the solution applying devices for implementing the present invention, and are provided therein with head portions 43*a*, 44*a*, 45*a*, and 46*a*, respectively. These head portions each have the structure explained in Embodiment 1 or 2, and in each head portion, application of a solution containing an organic compound or inorganic compound and formation of a thin film are performed under reduced pressure. Of course, each head portion may be provided with a heating mechanism for heating the substrate 40 at a room temperature (typically, 20° C.) to 300° C., preferably 50 to 200° C.

Further, in FIG. 9B, a side view of the film forming chamber (light emitting layer) 45, corresponds to the state in which the head portion, which moves along the substrate surface, is seen from the above. An arrow 51 denotes a moving direction of the head portion 45*a*. The head portion moves from one end to the other end of the substrate 40 in parallel with the substrate surface, through which the solution application and the formation of a thin film are performed. Note that a distance (L) between the substrate 40 and a tip end portion (ejection opening) of the head portion 45*a* is 2 to 20 mm.

Further, at this time, nitrogen, rare gas, or other fluorine gas flows vertically in a direction perpendicular to a sheet surface in each of the film forming chambers 43 to 46, and a laminar flow of an inert gas is formed between the substrate 40 and each of the head portions 43*a* to 46*a*. At this time, the flowing inert gas can be heated instead of or in combination with heating of the substrate. Of course, vacuum can be kept without introduction of the inert gas.

Moreover, the film forming chamber 47 is a chamber for forming a metal film that becomes a cathode by a sputtering method, and the film formation is performed while the substrate 40 passes a rectangular target 47*a*. For example, there can be formed a metal film, which contains en element that belongs to Group 1 or 2 of the periodic table, such as an alloy film of aluminum and lithium. The shape of the target 47*a* is not limited to the above-described one. However, there can be given, as the merit of putting the substrate 40 upright, a point that the usage of a target having a long, narrow shape such as a liner shape, rectangular shape, or oblong shape can both secure high throughput and reduce an area of the device.

Note that there is given, as a characteristic of the present invention, a point that a burning step or the like is not required since the solution application and the formation of a thin film are performed simultaneously, but a burning step such as heating in vacuum may be provided among the film forming chambers 43 to 47. This is because it is considered that, when the solvent component is removed from the thin film such as the light emitting layer, reliability is improved accordingly.

Embodiment 11

In this embodiment, FIGS. 10A and 10B show an example in which the solution applying device used in implementing the present invention is combined with an in-line type manufacturing device in which the steps of the formation of a light emitter up through the sealing of a light emitting element are performed. Note that FIG. 10A is a top view of the manufacturing device, and FIG. 10B is a side view of the manufacturing device.

In FIGS. 10A and 10B, reference numeral 61 denotes a load chamber for carrying in a substrate; 62 denotes an unload chamber for taking out a substrate; 63 denotes a film forming chamber for forming a hole injecting layer; 64 denotes a film forming chamber for forming a light-emitting layer; 65 denotes a film forming chamber for forming an electron injecting layer; 66 denotes a film forming chamber for forming a metal film that serves as a cathode; and 67 denotes a film forming chamber for a protection film having a passivation effect. An arrow 70 in the figure denotes a conveying direction of a substrate 60, and the substrate that has been already processed is expressed by dotted lines. At this time, the substrate 60 is conveyed in the state of being upright, that is, in the state in which a surface (surface to be processed) thereof is in parallel with a gravitational direction.

The film forming chambers 63 to 65 are the solution applying devices for implementing the present invention, and are provided therein with head portions 63*a*, 64*a*, 65*a*, respectively. These head portions each have the structure explained in Embodiment 1 or 2, and in each head portion, application of a solution containing an organic compound or inorganic compound and formation of a thin film are performed under reduced pressure. Of course, each head portion may be provided with a heating mechanism for heating the substrate 60 at a room temperature (typically, 20° C.) to 300° C., preferably 50 to 200° C.

Further, in FIG. 10B, a side view of the film forming chamber (light emitting layer) 64, corresponds to the state in which the head portion, which moves along the substrate surface, is seen from the above. An arrow 71 denotes a moving direction of the head portion 64a. The head portion moves from one end to the other end of the substrate 60 in parallel with the substrate surface, through which the solution application and the formation of a thin film are performed. Note that a distance (L) between the substrate 60 and a tip end portion (ejection opening) of the head portion 64a is 2 to 20 mm.

Further, at this time, nitrogen, rare gas, or other fluorine gas flows vertically in a direction perpendicular to a sheet surface in each of the film forming chambers 63 to 65, and a laminar flow of an inert gas is formed between the substrate 60 and each of the head portions 63a to 65a. At this time, the flowing inert gas can be heated instead heating the substrates or while heating the substrates. Of course, vacuum can be kept without introduction of the inert gas.

Moreover, the film forming chamber 66 is a chamber for forming a metal film that becomes a cathode by a sputtering method, and the film formation is performed while the substrate 60 passes a rectangular target 66a. For example, there can be formed a metal film, which contains en element that belongs to Group 1 or 2 of the periodic table, such as an alloy film of aluminum and lithium. The shape of the target 66a is not limited to the above-described one. However, there can be given, as the merit of putting the substrate 60 upright, a point that the usage of a target having a long, narrow shape such as a liner shape, rectangular shape, or oblong shape can both secure high throughput and reduce an area of the device.

Further, the film forming chamber 67 is a chamber for forming an insulating film that includes a passivation effect by a sputtering method (preferably, a high-frequency sputtering method), and the film formation is performed while the substrate 60 passes a rectangular target 67a as same as Embodiment 7. For example, there can be formed a highly dense silicon compound film, such as a silicon nitride film and silicon oxynitride film. The shape of the target 67a is not limited to the above-described one. However, there can be given, as the merit of putting the substrate 60 upright as same as Embodiment 7, a point that the usage of a target having a long, narrow shape such as a linear shape, rectangular shape, or oblong shape can both secure high throughput and reduce an area of the device.

Note that there is given, as a characteristic of the present invention, a point that a burning step or the like is not required since the solution application and the formation of a thin film are performed simultaneously, but a burning step such as heating in vacuum may be provided among the film forming chambers 63 to 66. This is because it is considered that, when the solvent component is removed from the thin film such as the light emitting layer, reliability is improved accordingly.

Embodiment 12

Embodiment 10 and Embodiment 11 has illustrated the case where the substrate to be treated was conveyed in an erected state, i.e., in a state where it was conveyed with its surface to be treated in parallel with the direction of gravity. This embodiment, however, has a different constitution as will be described with reference to FIGS. 11A to 11D.

Figure 11A:
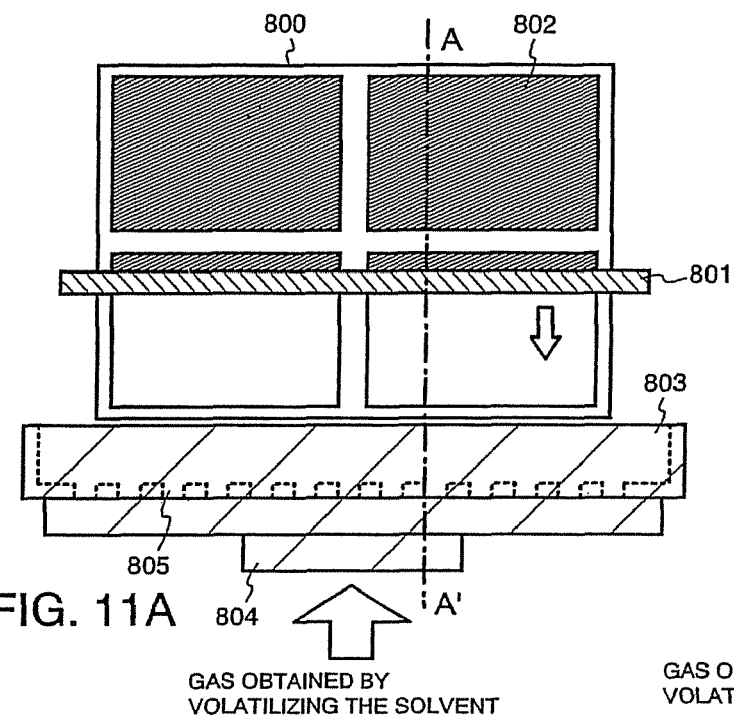
FIGS. 11A to 11D are views showing a method of manufacturing a light emitting device according to the present invention.
Figure 11B:
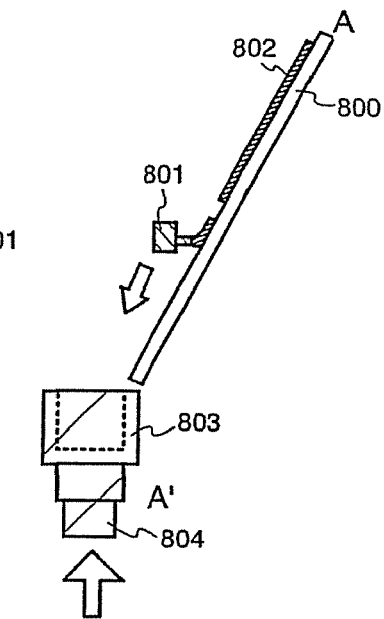

FIGS. 11A and 11B are views illustrating the steps of producing the light emitters according to this embodiment, and wherein a head portion 801 of the solution applying device scans along the surface of a substrate 800. The head portion 801 injects a solution containing the light-emitter composition in a manner described in the embodiments 1 to 3, and the light emitter 802 is formed through the step of firing. Here, the feature of this embodiment resides in that the substrate 800 is installed so as to be at an angle relative to a horizontal plane. An angle which is too small or too great impairs the advantage of saving the space of the manufacturing device. Accordingly, it is desired that the angle of the film-forming surface of the substrate to be treated relative to the horizontal plane is from 70 to 95° (and, more preferably, from 80 to 90°).

Another feature of this embodiment is the provision of means for preventing the injection ports of the head portion 801 from drying after a predetermined step of application has been finished for the whole substrate. Namely, an accommodation portion 803 for accommodating the head portion 801 is installed under the substrate 800, and the interior thereof is filled with a gas obtained by volatilizing the solvent. The gas obtained by volatilizing the solvent (gas containing the solvent component) is introduced through an introduction port 804, and with which the interior of the accommodation portion 803 is filled through a plurality of openings 805 formed in the lower part of the accommodation portion 803.

Here, "the gas obtained by volatilizing the solvent" is a solvent capable of dissolving the light emitter that is to be formed and is, desirably, the same as the solvent for a solution containing the light-emitter composition injected from the head portion 801. The gas needs not be limited to the same solvent, as a matter of course, and may be suitably changed depending upon the kind of the light emitter to be formed.

Figure 11C:
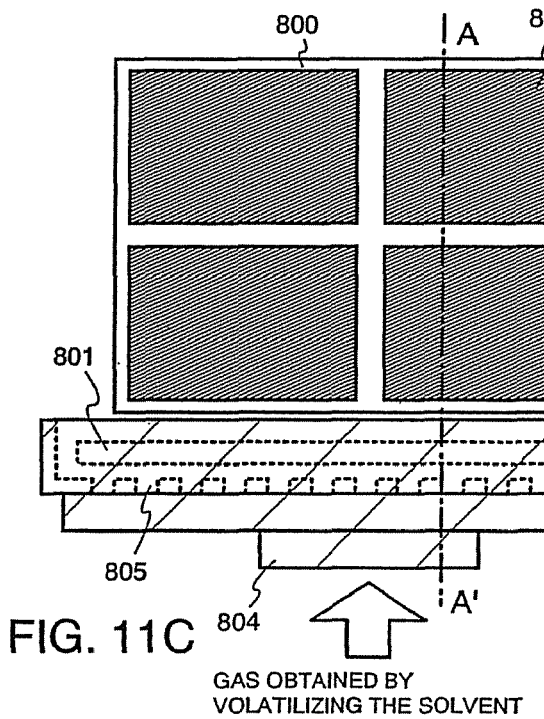
Figure 11D:
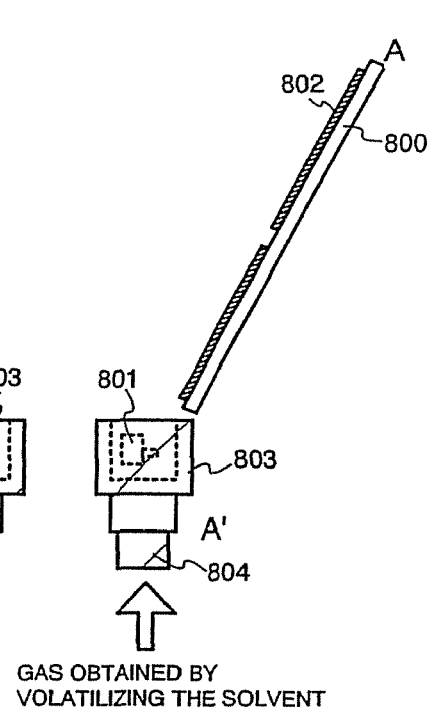

Next, FIGS. 11C and 11D illustrate the state of the head portion 801 at a moment after the step of forming the light emitter has been finished. As shown in FIGS. 11C and 11D, the head portion 801 is accommodated in the accommodation portion 803 so as to be completely concealed therein, and is exposed to the atmosphere of the solvent gas. Here, the accommodation portion 803 may be provided with a closure portion. After the head portion 801 is accommodated, therefore, the accommodation portion 803 may be covered with the closure to suppress the solvent component from diffusing toward the outer side. The head portion is secured by a support member that is not illustrated so as to perform the scanning operation. Therefore, the closure avoids the support member, as a matter of course.

According to this embodiment as described above, the feature resides in that after the step of forming the light emitter has been finished, the head portion is exposed to the atmosphere filled with the solvent capable of dissolving the light emitter that is to be formed. At the injection portions of the head portion 801, therefore, the light-emitter composition dissolves in the solvent, and there occurs no restriction due to drying. Namely, there is established a non-drying environment even when the injection of the light-emitter composition is interrupted. Unlike the conventional so-called ink jet method, there is no need of continuing the injection of solution at all times to prevent drying, decreasing the ratio of wasteful injection and improving the utilization efficiency of the light-emitter composition.

Note that this embodiment describes a case where the embodiment is applied to the method of manufacturing the light-emitting device in which solution is applied while the substrate is kept in upright. However, it goes without saying that the technical idea that the head portion is exposed to the atmosphere filled with the solvent ingredients so as to prevent drying after applying solutions is applicable to the case where a substrate is vertically installed as a conventional way.

This embodiment can be combined with the manufacturing device including the constitution of any one of Embodiments 4 to 5 and 9 to 11. Further, this embodiment can be used to the method of manufacturing the light emitting device including any constitution of Embodiments 6 to 8.

Embodiment 13

Figure 12A:
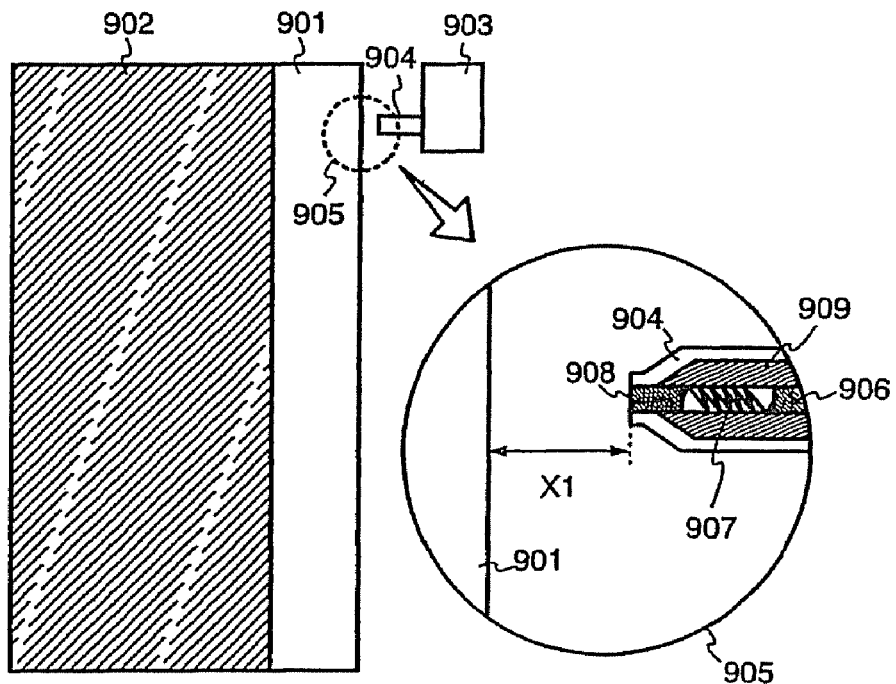
FIGS. 12A and 12B are sectional views of a solution applying device used for implementing the present invention.
Figure 12B:
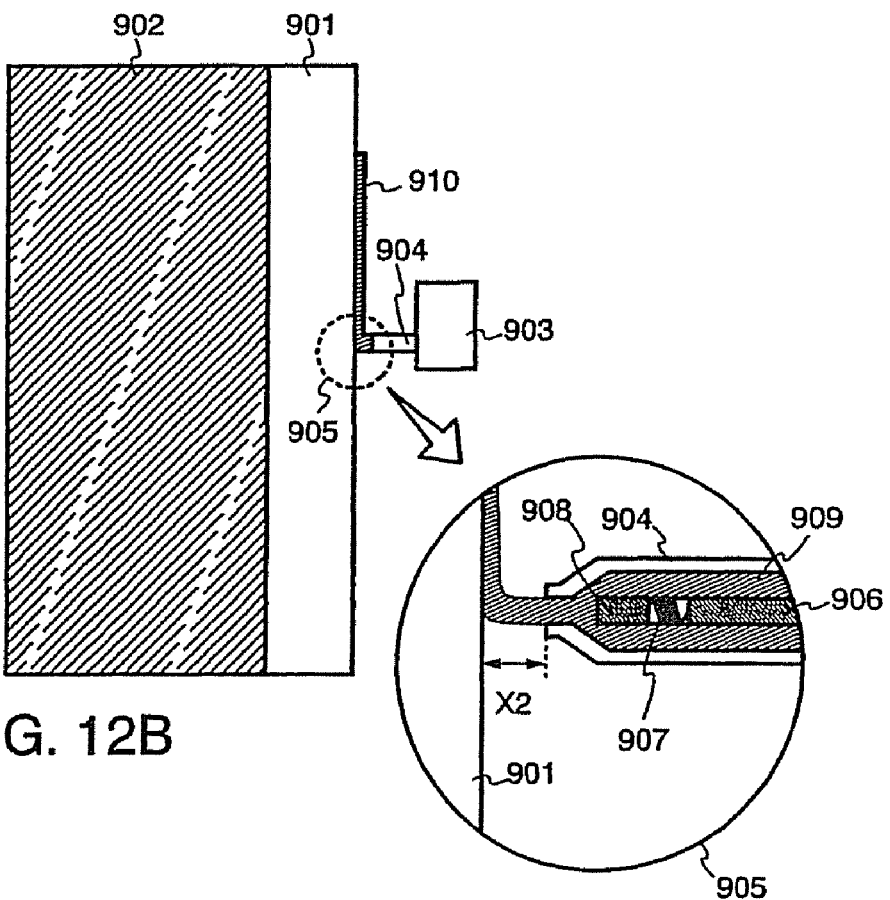

This embodiment deals with the constitution of the head portion of the solution applying device used for the method of manufacturing the light emitting device of the invention with reference to FIGS. 12A and 12B. This embodiment shows a mode in which solution is applied while a substrate is kept in upright (corresponding to Embodiments 10 and 11). However, this embodiment can be put into practice in the case where a substrate is vertically installed.

In FIG. 12A, a substrate 901 is supported by a susceptor 902 made from a magnetic substance, and is vertically installed (which includes an inclined installation). The head portion 903 of the solution applying device is provided close to the front surface of the substrate 901. An end of the nozzle (injection port) 904 on an enlarged scale is encircled by a dotted line 905. The interior of the nozzle has a hollow structure, and includes a core 906 secured therein, and a cap (hereinafter referred to as a magnetic cap) 908 made from a magnetic substance which is coupled to the core 906 via a resilient member (spring in this embodiment) 907. The outer side of the hollow structure is filled with a solution 909 containing the light-emitter composition.

The material of the magnetic cap 908 is so selected that a repulsion is produced relative to the susceptor 902 made from a magnetic material. In the case of FIG. 12A, the distance X1 between the substrate 901 and the magnetic cap 908 is so selected that the repulsion does not effectively work between the susceptor 902 and the magnetic cap 908, the distance being determined depending upon the magnetic material, thickness of the substrate and the like. When the repulsion does not effectively work between the susceptor 902 and the magnetic cap 908, the magnetic cap 908 is pushed by the resilient member 907 and is stuffed at the end of the nozzle 904, so that the solution 909 containing the light-emitter composition will not be injected.

After the start of the application of solution, on the other hand, the distance between the substrate 901 and the magnetic cap 908 is shortened to X2 as shown in FIG. 12B. The distance X2 is the one in which the repulsion works sufficiently between the susceptor 902 and the magnetic cap 908. Due to this repulsion, the magnetic cap 908 compresses the resilient member 907 to push it into the hollow structure. Then, a space is maintained at the end of the nozzle 904, and the solution 909 containing the light-emitter composition is injected. Thus, the solution 909 containing the light-emitter composition is applied onto the surface of the substrate 901, the solvent is volatilized under a reduced pressure, or the solvent is volatilized being heated by the substrate 901 thereby to form a light emitter 910.

By forming the susceptor and the cap at the end of the nozzle by using magnetic substances of such a relationship that produces a repulsion relative to each other, it is allowed to establish a constitution that applies the solution contained therein when they are brought close to each other up to a predetermined distance and, hence, to maintain uniformity in the distance between the substrate and the head portion (nozzle in a strict sense). This technology is effective particularly in applying the solution onto the substrate having rugged surfaces.

This embodiment can be combined with the manufacturing device having any constitution of Embodiments 4 to 5, and 9 to 12. Further, this embodiment can be used to the method of manufacturing the light emitting device including any constitution of Embodiments 6 to 8.

Embodiment 14

In this embodiment description will be made of an example, in which a multi-chamber type manufacturing device is applied to the manufacturing device of the light emitting device, in which conveyance and film formation are performed in a state in which a substrate is kept upright, as shown in Embodiments 12 and 13, with reference to FIG. 13. Note that respective chambers are coupled with a gate valve so as to be kept in an airtight state.

Figure 13:
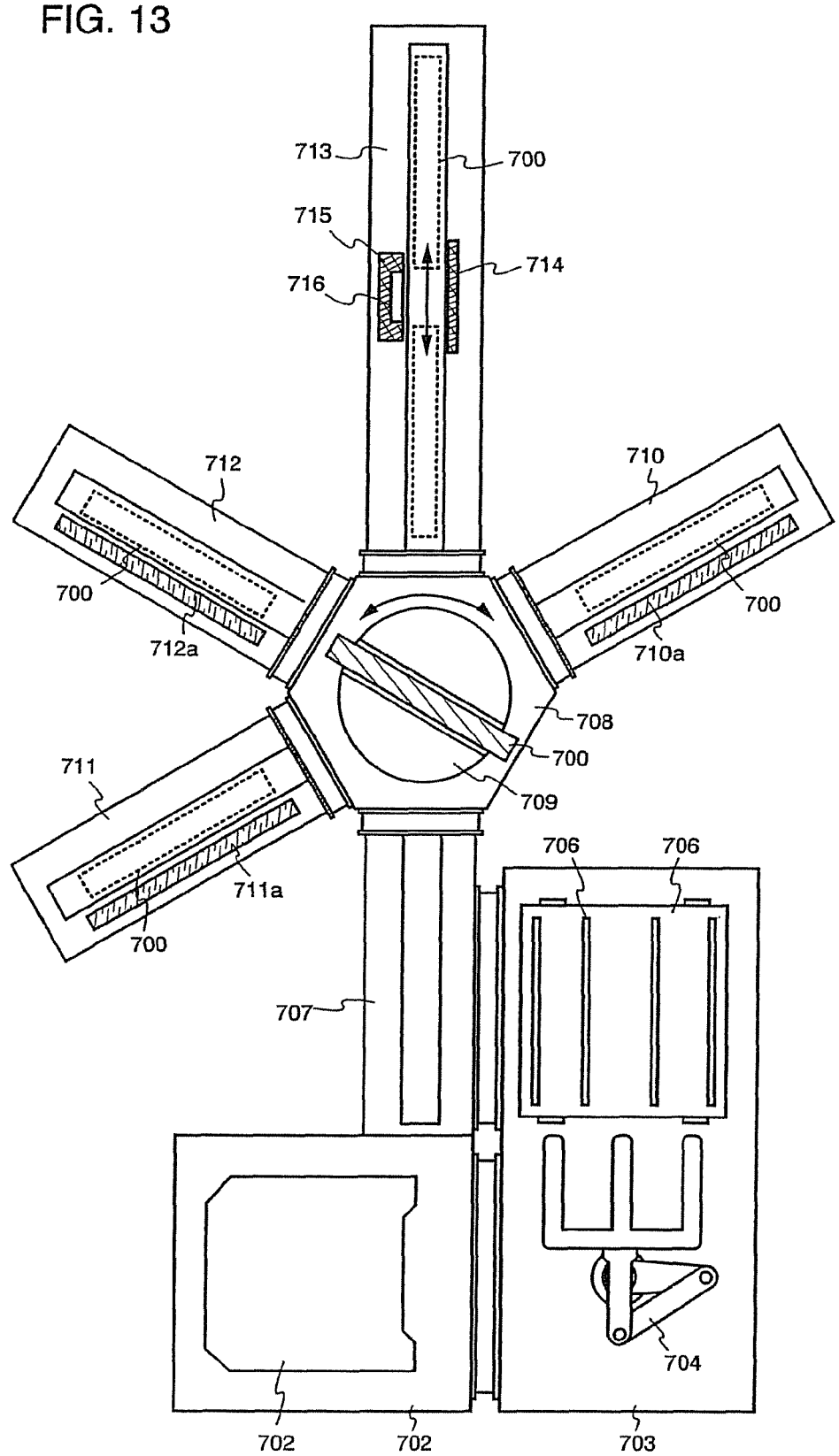
FIG. 13 is a top view of a manufacturing device used for implementing the present invention.

In FIG. 13, a carrier 702 for conveying a substrate is provided in a stock chamber 701. The stock chamber 701 is coupled with a conveying chamber 703 through the gate valve, and the substrate mounted on the carrier 702 is conveyed by a conveying arm 704 to be placed on a substrate mounting base 705. At this time, the substrate is first mounted on a pusher pin 706, and then is placed on the substrate mounting base 705 by lowering the pusher pin 706.

The substrate mounting base 705 is fixed with the substrate, rises by 90°, moves to the inside of a load/unload chamber 707, and delivers the substrate to a susceptor 700. Note that the susceptor 700 expressed by dotted lines indicates that, although the susceptor exists at the position in substrate processing, the substrate and the susceptor move as an integrated piece in accordance with the progress of the process and do not exist at that time.

The delivered substrate in the load/unload chamber 707 moves integrally with the susceptor 700 along with a rail, and is conveyed to a common chamber 708 coupled with the gate valve. A turn table 709 is provided in the common chamber 708 When the susceptor 700 is mounted on the turn table 709, the turn table 709 is rotated, and there is selected the chamber with which the common chamber is coupled through the gate valve and in which the next processing is to be performed.

The manufacturing device in this embodiment is provided with, as the chambers in which processing is performed, a film forming chamber for forming a hole transporting layer (HTL) (HTL film forming chamber) 710, a film forming chamber for forming a light emitting layer (light emitting layer film forming chamber) 711, a film forming chamber for forming an electron transporting layer (ETL) (ETL film forming chamber) 712, and a film forming chamber for forming a conductive film with a sputtering method (sputtering film forming chamber) 713. The film forming chambers 710 to 712 for forming a light emitter are each provided with the solution applying device explained in Embodiment 1, 2, or 3, and each are a chamber in which film formation of a light-emitter composition is performed through solution application of ink jet or the like under reduced pressure. Note that the respective chambers are provided with head portions 710a to 712a of each solution applying device, and film formation is performed through scanning in a direction in which the head portion faces a sheet surface (that is, a direction along the substrate surface).

Further, the film forming chamber 713 for forming a cathode with the sputtering method is provided with electrodes 714 and 715 and a target 716, and these members are all have a columnar or prolate ellipsoidal shape. The substrate attached to the susceptor 700 is conveyed in an arrow direction, and film formation is performed when the substrate passes the target 716. At this time, the sputtering method may be either a DC (direct current) sputtering method or RF (alternating current) sputtering method.

Then, the substrate (susceptor), which has already been processed in the respective chambers, returns to the load/unload chamber 707, and is received in the carrier 702 through the substrate mounting base 705 and the like. From the above, the steps up through the step of the formation of the cathode of the light emitting element are completed. Note that, although the description is made of the manufacturing device for performing the steps up through the step of the formation of the cathode in this embodiment, the number of chambers may be increased in order to complete formation of a passivation film (protective film) or a sealing step with a can or the like. Further, the structure of the light emitter is not limited to the one in this embodiment. Further, the structure may be applied to the formation of the composition as shown in Embodiment 6. In this case, the number of chambers, the processing contents of the film forming chambers, and the like may be changed.

Note that this embodiment may be equipped with the structures of Embodiments 4 and 5, and may be used for the manufacture of the light emitting devices described in Embodiments 7 and 8. Further, as to the film forming chambers, the structures of Embodiments 12 and 13 may be applied to this embodiment.

Embodiment 15

Figures 14A, 14B:
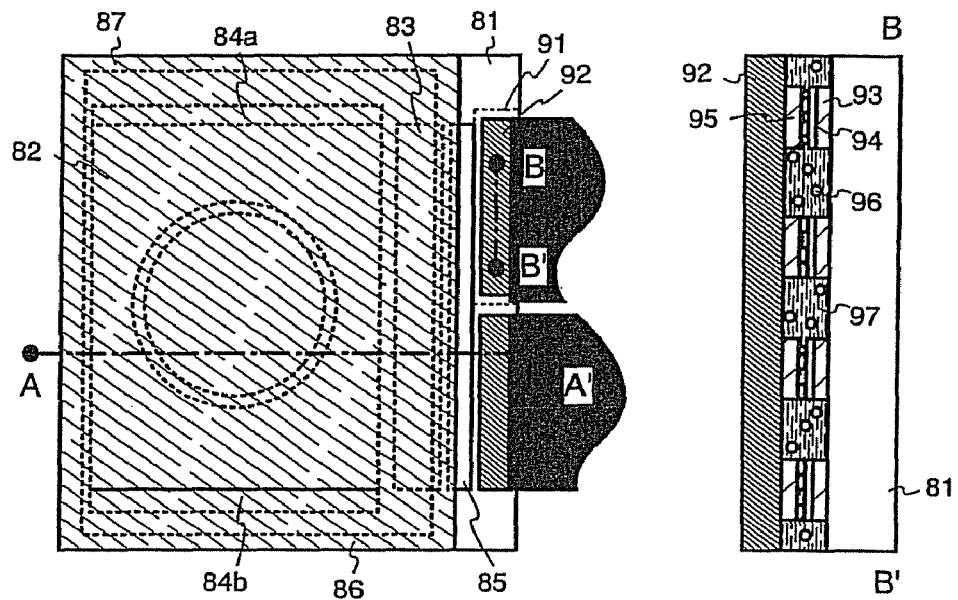
FIGS. 14A to 14C are views showing an outer appearance of a light emitting device obtained by implementing the present invention.
Figure 14C:
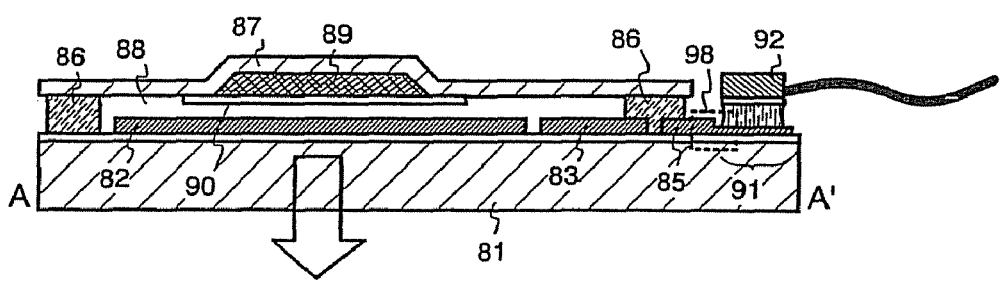

In this embodiment, the constitution of the entire light emitting device obtained by implementing the present invention will be described with reference to FIGS. 14A to 14C. FIG. 14A is a top view of a light emitting device prepared by sealing a element substrate on which a thin film transistor is formed with a sealing material. FIG. 14B is a cross sectional view along a line of B-B' in FIG. 14A and FIG. 14C is a cross sectional view along a ling A-A' of FIG. 14A.

A pixel portion (display portion) 82 is mounted on a substrate 81. In addition, a data line drive circuit 83, gate line drive circuits 84a and 84b, and a protective circuit 85 are arranged on the substrate 81 so as to surround the pixel portion 82. Furthermore, a sealing material 86 is provided such that it surrounds these structural components. The pixel portion 82 has light emitting elements obtained by implementing the present invention. The sealing material 86 may be an ultraviolet curing resin, an epoxy resin, or the like. Preferably, the sealing material may be a material with lowest possible hygroscopic property. By the way, the sealing material 86 may be formed such that it is piled up on part of the data line drive circuit 83, gate line drive circuits 84a and 84b, and a protective circuit 85, or may be provided such that it makes a detour to avoid these circuits.

Furthermore, a sealing member 87 is adhered on the substrate 81 by using the sealing material 86 and a sealed space 88 is formed from the substrate 81, the sealing material 86 and the sealing member 87. The sealing member 87 may be a glass material, a metal material (typically, a stain steel material), a ceramic material, or a plastic material (including a plastic film). In addition, sealed only by an insulating film as shown in Embodiment 8 also is possible.

Furthermore, when a material which is different from the substrate 81 is used as the sealing member 87, there is a possibility of impairing the adhesion properties of the sealing material 86 as a result of the difference between their thermal expansion coefficients. Therefore, the sealing member 87 may be preferably the same material as that of the substrate 81 on which the transistor is formed. In other words, it is preferable to use a material having the same thermal expansion coefficient as that of the substrate 81. In this embodiment, glass is used as a material of the substrate 81 and the sealing member 87. In addition, the sealing member 87 may be subjected to the same heat history as that of the substrate 81 in the step of preparing a thin film transistor, so that their thermal expansion coefficients will be in close agreement with each other.

The sealing member 87 has a concave portion in which a moisture absorbent (e.g., barium oxide or calcium oxide) 89 is placed in advance to keep the closed space 88 under clear atmosphere by adsorbing moisture, oxygen, or the like. Thus, the sealing member 87 plays a role in the inhibition of deterioration of an EL layer. The concave portion is covered with a small-meshed cover material 90. In addition, air and moisture can pass through but the moisture absorbent 89 cannot. Furthermore, the closed space 88 may be filled with rare gas such as nitrogen or argon, or alternatively a resin or a liquid may be filled as far as it is inactive.

Furthermore, on the substrate 81, a terminal part 91 for transmitting signals to the data line drive circuit 83 and the gate line drive circuits 84a, 84b is formed In addition, data signals such as video signals are transmitted to the terminal part 91 through a flexible print circuit (FPC) 92. The cross sectional view of the terminal part 91 is shown in FIG. 14B, in which a wiring having a structure in which an oxide conductive film 94 is piled up on a wiring 93 simultaneously formed with a gate wiring or a data wiring and a wiring 95 formed toward the FPC 92 are electrically connected to each other using a resin 97 in which particles of a conductive material 96 are dispersed. Here, the conductive material may be a spherical polymer compound coated with gold or silver plating.

In the present embodiment, the protective circuit 85 is placed between the terminal part 91 and the date line drive circuit 83 and is responsible for releasing a pulse signal outside when the static electricity is caused by sudden pulse signals and the like between them. Simultaneously, at first, a capacitor weakens a high voltage signal momentally introduced, and other high voltage signals may be allowed to escape to the outside by a circuit constructed of a thin film transistor or a thin film diode. Alternatively, the protective circuit may be formed on other place, such as one between the pixel portion 82 and the data line drive circuit 83, and between the pixel portion 82 and the gate line drive circuits 84a, 84b, for example.

Embodiment 16

The structures of the thin film transistor described in Embodiments 7 and 8 all become a top-gate structure (specifically, planar structure). In each embodiment, however, a bottom-gate structure (typically, reverse stagger structure) can be adopted as well.

It should be understood that the application thereof is not limited to the thin film transistor but may be made from a MOS structure transistor formed by using silicon well. Further, instead of the thin film transistor, using a MIM (metal-insulator-metal) element and the like represented by a diode (also referred to as two terminals element) also is possible.

In any case, when an active matrix light emitting device is produced, the primary effect of the invention will not be impaired by the structure of switching elements such as the structure of transistors.

Embodiment 17

Electronic apparatuses can be produced by employing a light emitting is device obtained by implementing the present invention to a display portion therein. Examples of the electronic apparatuses can be given as a video camera, a digital camera, a goggle type display (head mounted display), a navigation system, an audio reproducing apparatus (a car audio, an audio component, and the like), a laptop computer, a game machine, a portable information terminal (a mobile computer, a cellular phone, a portable game machine, an electronic book, etc.), and an image reproducing apparatus including a recording medium (specifically, an apparatus capable of processing data in a recording medium such as a Digital Versatile Disk (DVD) and having a display that can display the image of the data). Practical examples thereof are shown in FIGS. 15A to 15H.

Figure 15A:
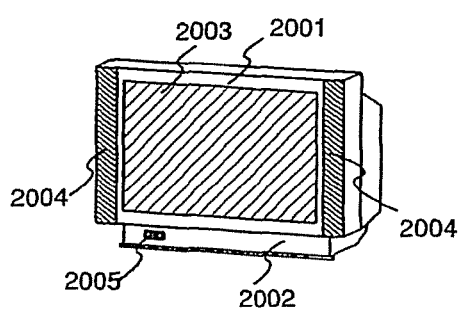
FIGS. 15A to 15H are diagrams of examples of electronic devices each of which is equipped with the light emitting device obtained by implementing the present invention.

FIG. 15A shows a television, which comprises a casing 2001, a supporting base 2002, a display portion 2003, speaker units 2004, a video input terminal 2005, etc. The present invention is applied to the display portion 2003. The term television includes every television for displaying information such as one for a personal computer, one for receiving TV broadcasting, and one for advertisement.

Figure 15B:
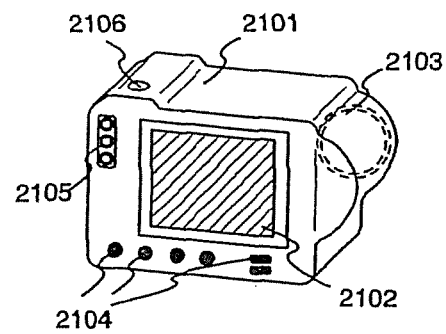

FIG. 15B shows a digital camera, which comprises a main body 2101, a display portion 2102, an image receiving unit 2103, operation keys 2104, an external connection port 2105, a shutter 2106, etc. The present invention is applied to the display portion 2102.

Figure 15C:
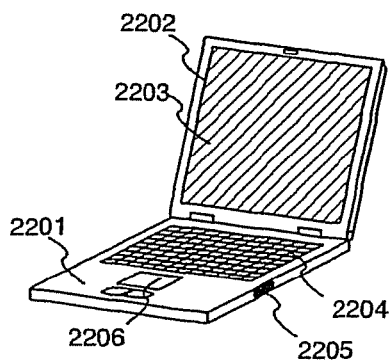

FIG. 15C shows a laptop computer, which comprises a main body 2201, a casing 2202, a display portion 2203, a keyboard 2204, an external connection port 2205, a pointing mouse 2206, etc. The present invention is applied to the display portion 2203.

Figure 15D:
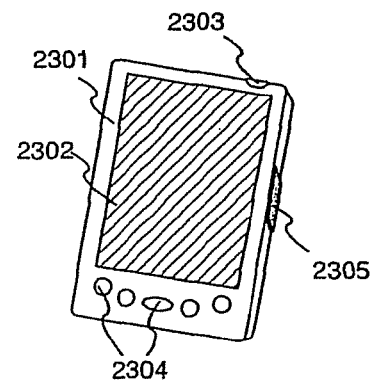

FIG. 15D shows a mobile computer, which comprises a main body 2301, a display portion 2302, a switch 2303, operation keys 2304, an infrared ray port 2305, etc. The present invention is applied to the display portion 2302.

Figure 15E:
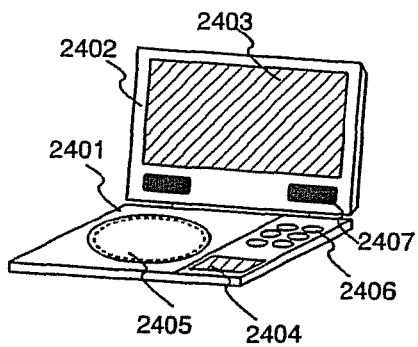

FIG. 15E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading unit 2405, operation keys 2406, speaker units 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 15F:
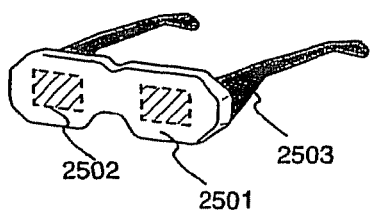

FIG. 15F shows a goggle type display (head mounted display), which comprises a main body 2501, display portions 2502, and arm units 2503. The present invention is applied to the display portion 2502.

Figure 15G:
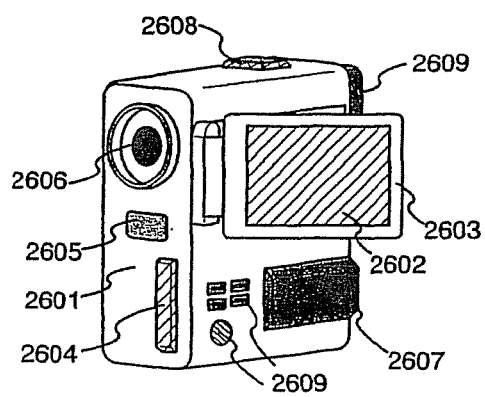

FIG. 15G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609 etc. The present invention is applied to the display portion 2602.

Figure 15H:
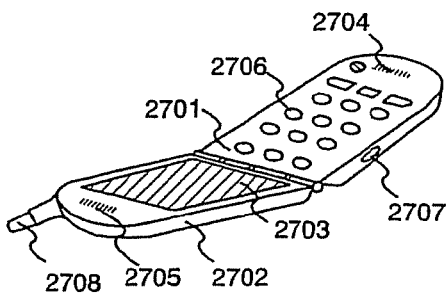

FIG. 15H shows a cellular phone, which comprises a main body 2701, a casing 2702, a display portion 2703, an audio input unit 2704, an audio output unit 2705, operation keys 2706, an external connection port 2707, an antenna 2708, etc. The present invention is applied to the display portion 2703. If the display portion 2703 displays white characters on a black background, power consumption of the cellular phone can be reduced.

As described above, the display device obtained by implementing the present invention may be used as the display portions of any electronic apparatus. The electronic apparatuses of the present embodiment may use any structure of the light emitting device shown in Embodiments 1 to 3 and 6 to 8.

According to the present invention, the application of the solution containing the light-emitter composition such as the organic compound or inorganic compound can be performed almost simultaneously with the formation of the thin film without particularly requiring the burning step or the like. As a result, the throughput in the manufacturing steps of the light emitting device can be significantly improved.

Further, the solvent component in the formed thin film is sufficiently removed simultaneously with the film formation. Thus, there can be avoided the defect that the light emitting layer itself is deteriorated due to degassing after the completion of the light emitting element. Therefore, the reliability of the light emitting device can be enhanced.

What is claimed is:

1. A method for manufacturing a light emitting device comprising:
   ejecting a solution containing a light emitting material toward an electrode under a pressure lower than atmospheric pressure,
   wherein the solution is ejected by an ink jet method.

2. The method for manufacturing the light emitting device according to claim 1, further comprising a step of heating the electrode while the solution is ejected.

3. The method for manufacturing the light emitting device according to claim 2, wherein the electrode is heated at from 50 to 200 degree Celsius.

4. The method for manufacturing the light emitting device according to claim 1, wherein the pressure is set from $1 \times 10^2$ to $2 \times 10^4$ Pa in an atmosphere of an inert gas.

5. The method for manufacturing the light emitting device according to claim 1, wherein the pressure is set at $5 \times 10^2$ to $5 \times 10^3$ Pa in an atmosphere of an inert gas.

6. The method for manufacturing the light emitting device according to claim 1, wherein the pressure is set from 1 to $5 \times 10^4$ Pa in vacuum.

7. The method for manufacturing the light emitting device according to claim 1, wherein the pressure is set at $1 \times 10^2$ to $1 \times 10^3$ Pa in vacuum.

8. The method for manufacturing the light emitting device according to claim 1, wherein the solution is ejected by a solution applying device including plural ejection portions.

9. The method for manufacturing the light emitting device according to claim 8, wherein each of the plural ejection portions is provided with a piexoelectric element.

10. The method for manufacturing the light emitting device according to claim 1, wherein the electrode is arranged to be approximately perpendicular with respect to a horizontal plane in the ejecting step.

11. The method for manufacturing the light emitting device according to claim 1, wherein the solution is a gel solution.

12. A method for manufacturing a light emitting device comprising:
   ejecting a solution containing a light emitting material from a ejection portion toward an electrode over a substrate under a pressure lower than atmospheric pressure continuously while moving a relative position of the ejection portion and the substrate.

13. The method for manufacturing the light emitting device according to claim 12, further comprising a step of heating the electrode while the solution is ejected.

14. The method for manufacturing the light emitting device according to claim 13, wherein the electrode is heated at from 50 to 200 degree Celsius.

15. The method for manufacturing the light emitting device according to claim 12, wherein the pressure is set from $1\times10^2$ to $2\times10^4$ Pa in an atmosphere of an inert gas.

16. The method for manufacturing the light emitting device according to claim 12, wherein the pressure is set at $5\times10^2$ to $5\times10^3$ Pa in an atmosphere of an inert gas.

17. The method for manufacturing the light emitting device according to claim 12, wherein the pressure is set from 1 to $5\times10^4$ Pa in vacuum.

18. The method for manufacturing the light emitting device according to claim 12, wherein the pressure is set at $1\times10^2$ to $1\times10^3$ Pa in vacuum.

19. The method for manufacturing the light emitting device according to claim 12, wherein the solution is ejected by a solution applying device including plural ejection portions.

20. The method for manufacturing the light emitting device according to claim 19, wherein each of the plural ejection portions is provided with a piexoelectric element.

21. The method for manufacturing the light emitting device according to claim 12, wherein the electrode is arranged to be approximately perpendicular with respect to a horizontal plane in the ejecting step.

22. The method for manufacturing the light emitting device according to claim 12, wherein the solution is a gel solution.

23. The method for manufacturing the light emitting device according to claim 1, wherein the solution is ejected continuously.

24. A method for manufacturing a light emitting device comprising:
ejecting a solution containing a light emitting material toward an electrode at a pressure of from $1\times10^2$ to $2\times10^4$ Pa in an atmosphere of an inert gas.

25. The method for manufacturing the light emitting device according to claim 24, further comprising a step of heating the electrode while the solution is ejected.

26. The method for manufacturing the light emitting device according to claim 25, wherein the electrode is heated at from 50 to 200 degree Celsius.

27. The method for manufacturing the light emitting device according to claim 24, wherein the pressure is set at $5\times10^2$ to $5\times10^3$ Pa in an atmosphere of the inert gas during the ejecting step.

28. The method for manufacturing the light emitting device according to claim 24, wherein the solution is ejected by a solution applying device including plural ejection portions.

29. The method for manufacturing the light emitting device according to claim 28, wherein each of the plural ejection portions is provided with a piexoelectric element.

30. The method for manufacturing the light emitting device according to claim 24, wherein the electrode is arranged to be approximately perpendicular with respect to a horizontal plane in the ejecting step.

31. The method for manufacturing the light emitting device according to claim 24, wherein the solution is a gel solution.

32. The method for manufacturing the light emitting device according to claim 24, wherein the solution is ejected by an ink jet method.

33. A method for manufacturing a light emitting device comprising:
ejecting a solution containing a light emitting material toward an electrode at a pressure of from 1 to $5\times10^4$ Pa in vacuum.

34. The method for manufacturing the light emitting device according to claim 33, further comprising a step of heating the electrode while the solution is ejected.

35. The method for manufacturing the light emitting device according to claim 34, wherein the electrode is heated at from 50 to 200 degree Celsius.

36. The method for manufacturing the light emitting device according to claim 33, wherein the pressure is set at $1\times10^2$ to $1\times10^3$ Pa in vacuum.

37. The method for manufacturing the light emitting device according to claim 33, wherein the solution is ejected by a solution applying device including plural ejection portions.

38. The method for manufacturing the light emitting device according to claim 37, wherein each of the plural ejection portions is provided with a piexoelectric element.

39. The method for manufacturing the light emitting device according to claim 33, wherein the electrode is arranged to be approximately perpendicular with respect to a horizontal plane in the ejecting step.

40. The method for manufacturing the light emitting device according to claim 33, wherein the solution is a gel solution.

41. The method for manufacturing the light emitting device according to claim 33, wherein the solution is ejected by an ink jet method.

* * * * *